(12) United States Patent
Nishimura

(10) Patent No.: US 10,470,310 B2
(45) Date of Patent: Nov. 5, 2019

(54) ELECTRONIC COMPONENT AND A METHOD FOR MANUFACTURING AN ELECTRONIC COMPONENT

(71) Applicant: ROHM CO., LTD., Kyoto (JP)

(72) Inventor: Isamu Nishimura, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 21 days.

(21) Appl. No.: 15/464,516

(22) Filed: Mar. 21, 2017

(65) Prior Publication Data

US 2017/0280564 A1 Sep. 28, 2017

(30) Foreign Application Priority Data

Mar. 24, 2016 (JP) ................... 2016-060252

(51) Int. Cl.
*H05K 1/18* (2006.01)
*H05K 1/03* (2006.01)
*H05K 1/11* (2006.01)
*H05K 3/00* (2006.01)
*H05K 3/30* (2006.01)
*H05K 3/40* (2006.01)
(Continued)

(52) U.S. Cl.
CPC ............... *H05K 1/181* (2013.01); *H01G 2/06* (2013.01); *H05K 1/0353* (2013.01); *H05K 1/111* (2013.01); *H05K 1/113* (2013.01); *H05K 1/186* (2013.01); *H05K 3/0044* (2013.01); *H05K 3/301* (2013.01); *H05K 3/303* (2013.01); *H05K 3/4007* (2013.01); *H05K 3/205* (2013.01); *H05K 2201/049* (2013.01); *H05K 2201/1003* (2013.01); *H05K 2201/10015* (2013.01); *H05K 2201/10022* (2013.01); *H05K 2201/10174* (2013.01); *H05K 2201/10378* (2013.01); *H05K 2201/10636* (2013.01); *Y02P 70/611* (2015.11)

(58) Field of Classification Search
CPC .. H05K 1/113; H05K 1/181; H05K 2201/049; H05K 2201/10378; H05K 3/301; H05K 3/303
See application file for complete search history.

(56) References Cited

U.S. PATENT DOCUMENTS 8,763,242 B2 * 7/2014 Kawano .................. H01L 23/66
29/841
9,129,943 B1 * 9/2015 Huemoeller ............ H01L 24/06
9,711,485 B1 * 7/2017 Berry ...................... H01L 24/14
(Continued)

*Primary Examiner* — Timothy J Thompson
*Assistant Examiner* — Rhadames Alonzo Miller
(74) *Attorney, Agent, or Firm* — Rabin & Berdo, P.C.

(57) ABSTRACT

An electronic component includes a first functional element including a pair of first connecting electrode portions formed on a first mounting surface, a pair of pillar electrodes connected to the corresponding first connecting electrode portions, a second functional element that includes a pair of second connecting electrode portions formed on a second mounting surface and that is arranged in a space defined by the first mounting surface of the first functional element and the pair of pillar electrodes, a pair of pad electrodes connected to the corresponding second connecting electrode portions, and a sealing resin that seals the pair of pillar electrodes, the pair of pad electrodes and the second functional element so as to expose the first lower surfaces of the pair of pillar electrodes and the second lower surfaces of the pair of pad electrodes.

23 Claims, 24 Drawing Sheets

(51) Int. Cl.
   *H01G 2/06*     (2006.01)
   *H05K 3/20*     (2006.01)

(56) References Cited

U.S. PATENT DOCUMENTS

| | | | |
|---|---|---|---|
| 2008/0179738 A1* | 7/2008 | Nishimura | H01L 21/563 257/737 |
| 2008/0290491 A1* | 11/2008 | Yamano | H01L 25/105 257/686 |
| 2011/0032685 A1* | 2/2011 | Akiba | H01L 24/06 361/782 |
| 2011/0244636 A1* | 10/2011 | Kondo | H01L 23/49822 438/127 |
| 2012/0205789 A1* | 8/2012 | Natsuaki | H01L 21/568 257/676 |
| 2012/0286407 A1* | 11/2012 | Choi | H01L 21/4853 257/670 |
| 2013/0026606 A1* | 1/2013 | Farooq | H01L 21/76898 257/621 |
| 2013/0069218 A1* | 3/2013 | Seah | H01L 23/13 257/712 |
| 2014/0048906 A1* | 2/2014 | Shim | H01L 23/481 257/531 |
| 2014/0110728 A1* | 4/2014 | Lee | H01L 33/62 257/88 |
| 2014/0124949 A1* | 5/2014 | Paek | H01L 23/49811 257/774 |
| 2014/0177134 A1 | 6/2014 | Awata et al. | |
| 2014/0367854 A1* | 12/2014 | Zhao | H01L 24/97 257/738 |
| 2015/0116968 A1* | 4/2015 | Yamada | H01L 24/32 361/767 |
| 2015/0255434 A1* | 9/2015 | Yazdani | H01L 21/486 257/737 |
| 2015/0257275 A1* | 9/2015 | Kusama | H05K 1/185 174/260 |
| 2015/0279759 A1* | 10/2015 | Miyakoshi | H01L 24/17 257/738 |
| 2015/0318344 A1* | 11/2015 | Wang | H01L 21/56 257/532 |
| 2016/0150632 A1* | 5/2016 | Viswanathan | H05K 3/284 361/761 |
| 2016/0316565 A1* | 10/2016 | Chen | H05K 1/185 |

* cited by examiner

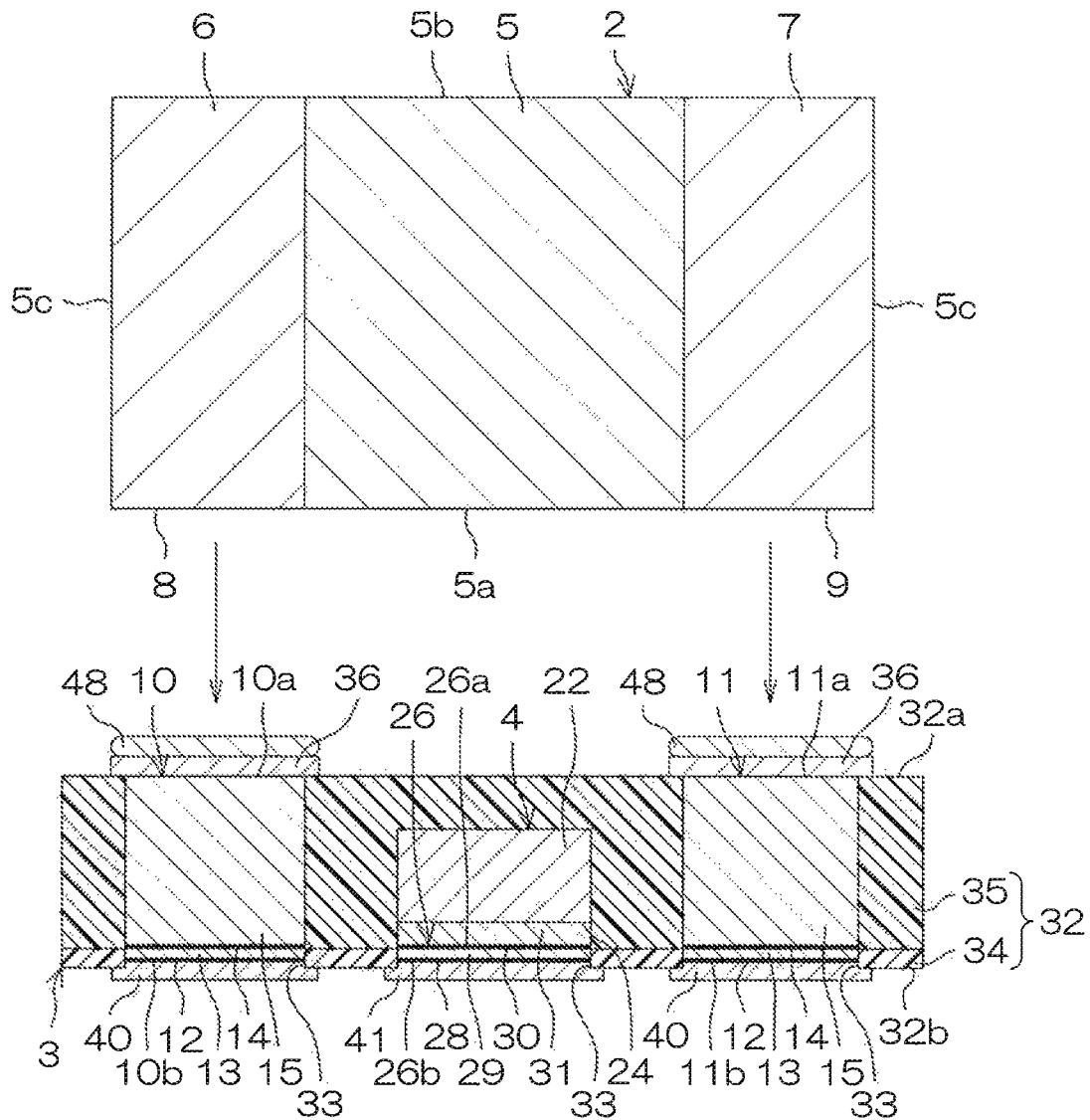

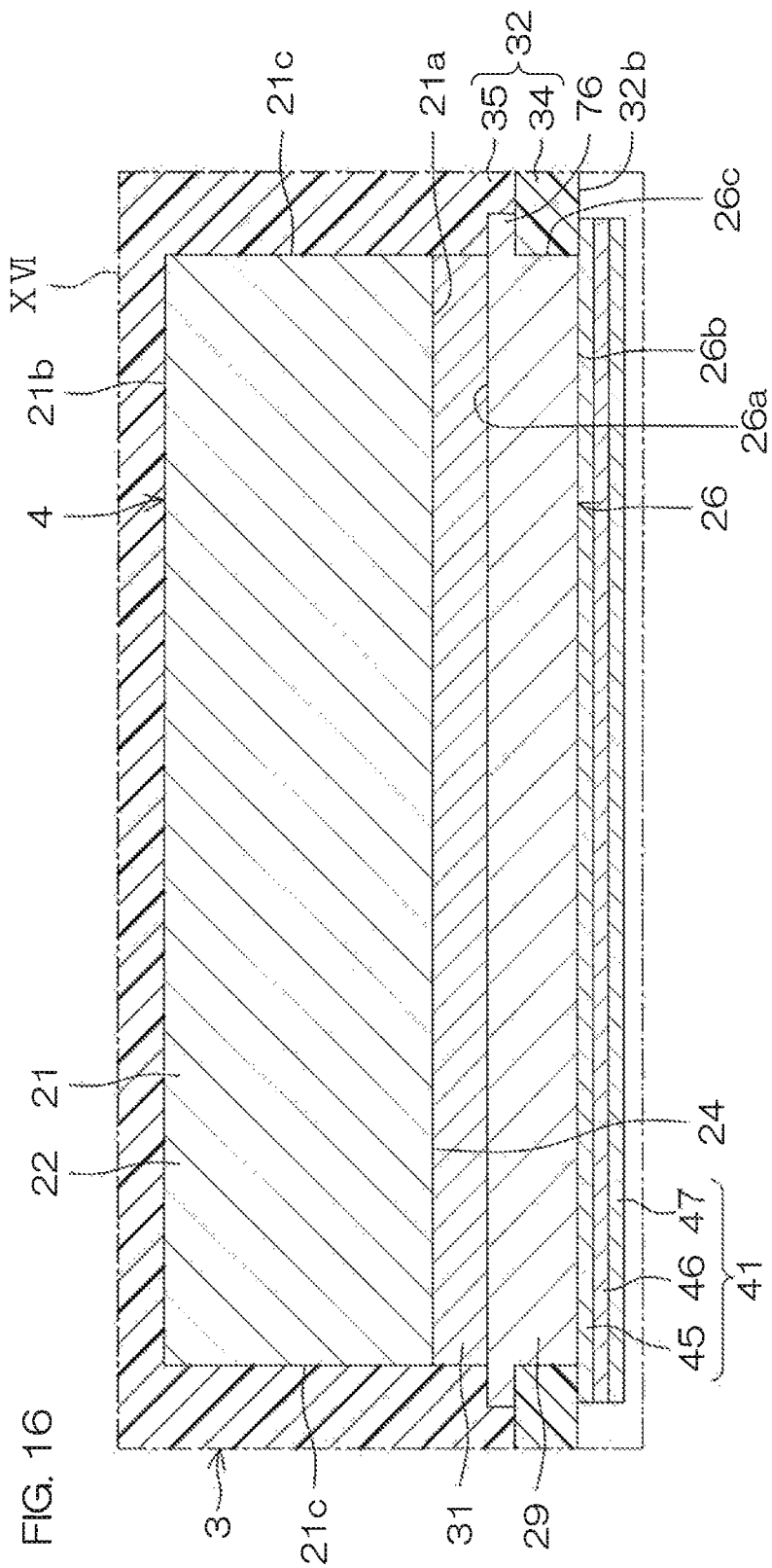

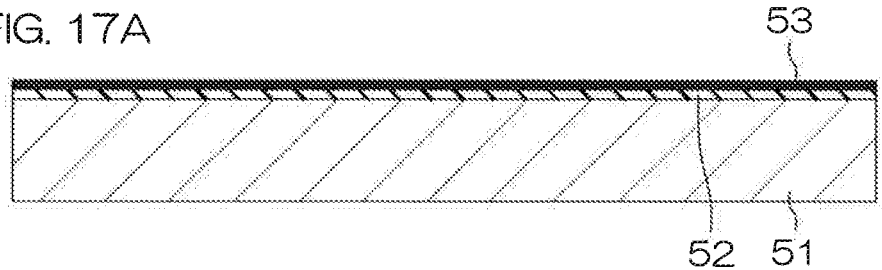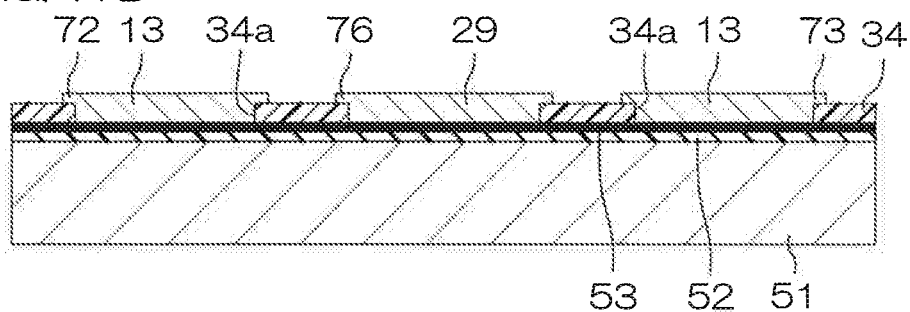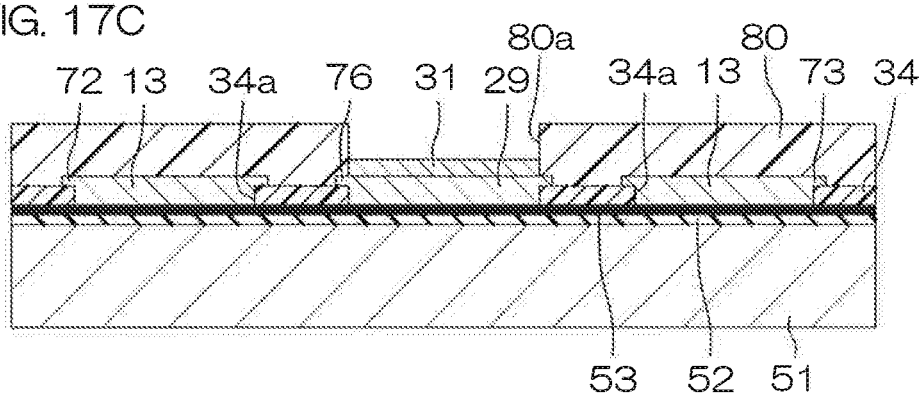

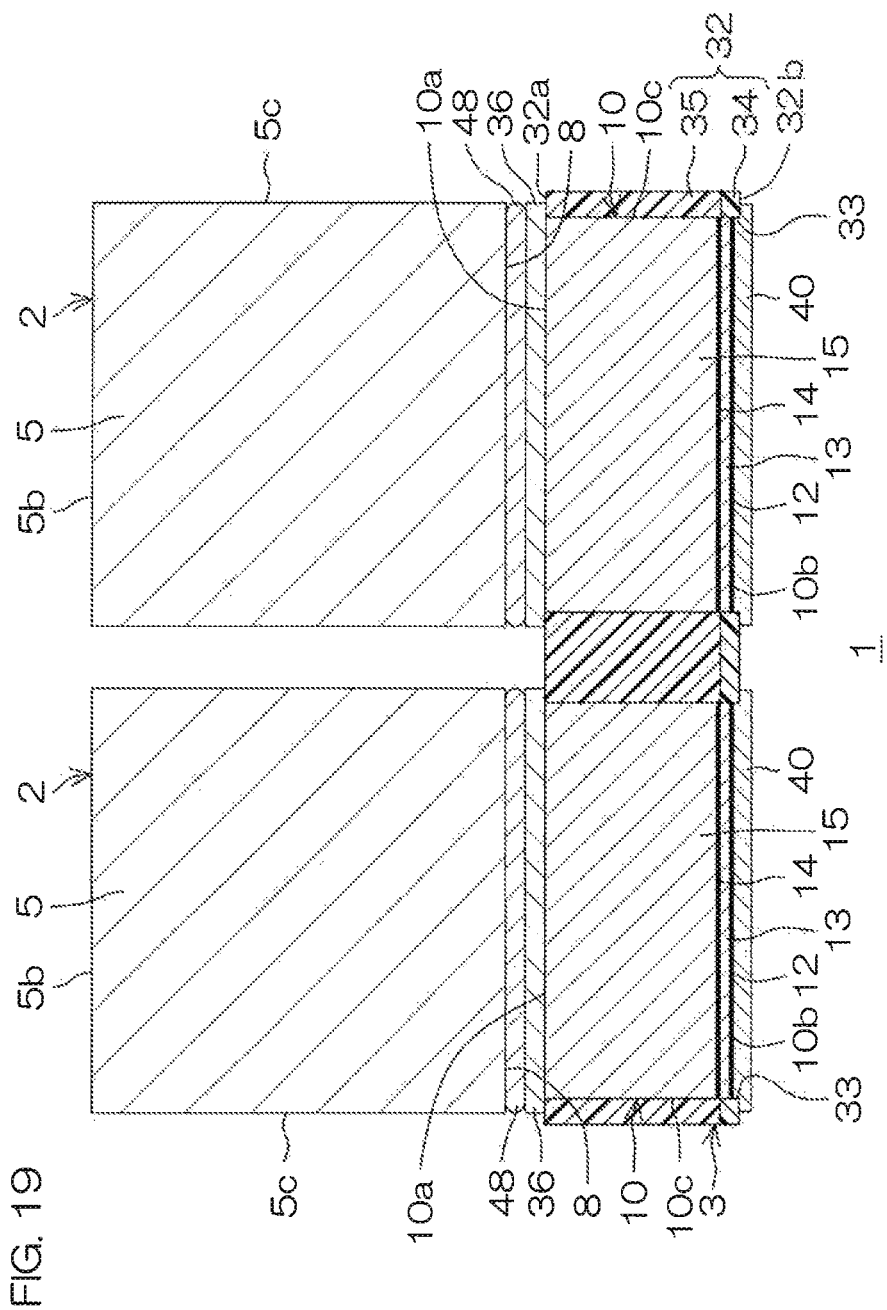

ELECTRONIC COMPONENT AND A METHOD FOR MANUFACTURING AN ELECTRONIC COMPONENT

BACKGROUND OF THE INVENTION

1. Field of the Invention

The present invention relates to an electronic component and a method for manufacturing an electronic component. The present invention also relates to an interposer whereon a functional element is mounted.

2. Description of the Related Art

US2014/0177134A1 discloses an electronic component that includes a laminated body in which ceramic dielectric layers and internal electrodes are alternately laminated.

SUMMARY OF THE INVENTION

An embodiment of the present invention provides an electronic component including a first functional element that includes a first mounting surface on which a pair of first connecting electrode portions is formed, a pair of pillar electrodes that have a first upper surface and a first lower surface respectively, the first upper surface is connected to the corresponding first connecting electrode portion, a second functional element that is arranged in a space defined by the first mounting surface of the first functional element and the pair of pillar electrodes and that includes a second mounting surface on which a pair of second connecting electrode portions is formed, a pair of pad electrodes that have a second upper surface and a second lower surface respectively, the second upper surface is connected to the corresponding second connecting electrode portion, and a sealing resin that is formed in a region below the first mounting surface of the first functional element and seals the pair of pillar electrodes, the pair of pad electrodes and the second functional element so as to expose the first lower surfaces of the pair of pillar electrodes and the second lower surfaces of the pair of pad electrodes.

An embodiment of the present invention provides an interposer including a pair of pillar electrodes that have a first upper surface and a first lower surface respectively and that is arranged at intervals each other, a pair of pad electrodes that have a second upper surface and a second lower surface respectively and that is arranged at intervals each other in a space between the pair of pillar electrodes, a functional element that has a mounting surface on which a pair of connecting electrode portions is formed and that is mounted onto the pair of pad electrodes in the space such that the pair of connecting electrode portions is connected to the second upper surfaces of the pair of pad electrodes, and a sealing resin that seals the pair of pillar electrodes, the pair of pad electrodes and the functional element so as to expose the first upper surfaces of the pair of pillar electrodes, the first lower surfaces of the pair of pillar electrodes and the second lower surfaces of the pair of pad electrodes.

An embodiment of the present invention provides a method for manufacturing an electronic component including a step of forming a pair of pillar electrodes at intervals on a substrate, a step of forming a pair of pad electrodes that have a thickness thinner than a thickness of the pair of pillar electrodes respectively at intervals in a space between the pair of pillar electrodes on the substrate, a step of mounting a small size functional element onto the pair of pad electrodes, a step of sealing the pair of pillar electrodes, the pair of pad electrodes and the small size functional element selectively by a sealing resin so that upper surfaces of the pair of pillar electrodes are exposed, a step of exposing lower surfaces of the pair of pillar electrodes and lower surfaces of the pair of pad electrodes by removing the substrate, and a step of mounting a large size functional element larger than the small size functional element onto the upper surfaces of the pair of pillar electrodes.

The above-described objects, features, and the advantages and/or other objects, features, and the advantages according to the present invention will be made apparent from the following description of preferred embodiments taken in conjunction with the accompanying drawings.

BRIEF DESCRIPTION OF THE DRAWINGS

FIG. 16 is an enlarged view of a region XVI shown in FIG. 14.

FIG. 17A to FIG. 17E are cross-sectional views showing steps of manufacturing the electronic component shown in FIG. 14.

FIG. 19 is a cross-sectional view showing a second modification of the electronic component shown in FIG. 1.

DETAILED DESCRIPTION OF THE PREFERRED EMBODIMENTS

Figure 1:
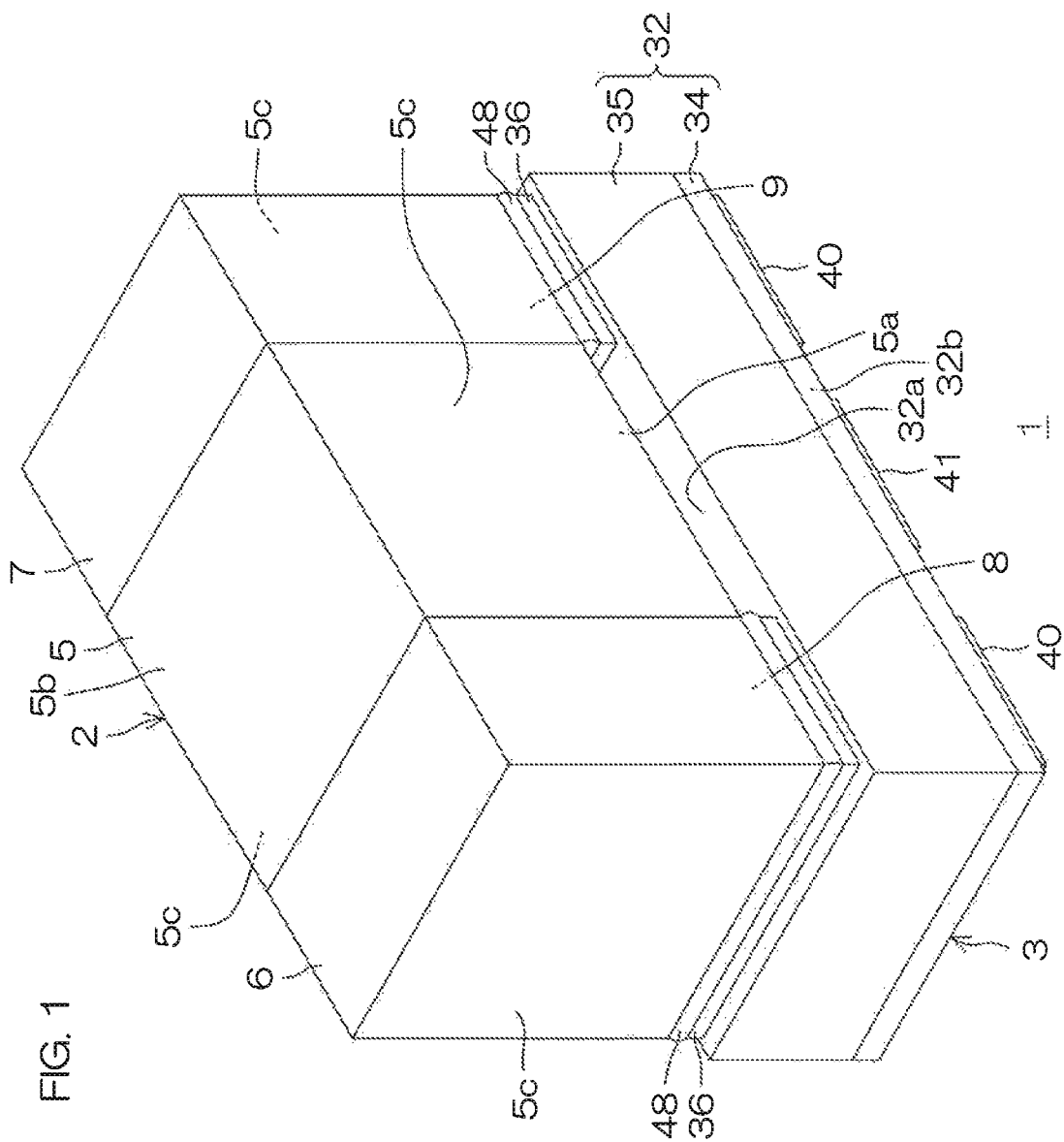
FIG. 1 is a perspective view of an electronic component according to a first preferred embodiment of the present invention.

In recent years, miniaturization of a functional element called chip component and high density mounting of functional elements to a mounting substrate are required. However, in case where a plurality of functional elements having the structure as disclosed in US2014/0177134A1 is mounted onto a mounting substrate, the plurality of functional elements is to be arranged side by side on the same plane. Such a mounting form is known as a two-dimensional mounting (hereinafter referred to as "2D mounting").

In the 2D mounting, there is a problem that the area occupied by the plurality of functional elements with respect to the mounting substrate is increased. It is conceivable to arrange the plurality of functional elements closely and mount so that the increase of the occupied area is suppressed. However, since the plurality of functional elements is subject to the wiring rule applied to the mounting substrate, there is a limit to the high density mounting by the 2D mounting.

The inventor of the present invention studies an electronic component that has a structure including a functional element having a mount surface on which a pair of connecting electrode portions is formed, and a pair of pillar electrodes that have a predetermined height respectively and that is connected to the corresponding connecting electrode portion.

According to the electronic component having such a structure, the functional element can be mounted onto the mounting substrate in a state where the functional element is separated from the mounting substrate by an amount corresponding to the height of the pair of pillar electrodes. Therefore, a space to be used for mounting the small functional element can be formed in a region between the mounting substrate and the mounting surface of the functional element. In this manner, three-dimensional mounting (hereinafter referred to as "3D mounting") can be realized.

According to the 3D mounting, two functional elements having different sizes are mounted in a laminated state along a normal direction of a main surface of the mounting substrate.

In the 3D mounting, a large size functional element to which the pair of pillar electrodes is connected is to be mounted onto the mounting substrate after a small size functional element is mounted onto the mounting substrate. Therefore, at least two steps are to be performed to realize the 3D mounting. Additionally, since the large size functional element is to be mounted after alignment to the small size functional element, time and effort are taken.

Thereby, saving the time and effort taken when the functional elements are mounted onto the mounting substrate is also one subject, in order to meet market demand that requires handling convenience of the functional element.

Therefore, a preferred embodiment according to the present invention is to provide an electronic component having a structure that is capable of efficiently mounting a plurality of functional elements having different sizes and that is excellent in handling convenience, and a method for manufacturing an electronic component having such a structure.

In addition, a preferred embodiment according to the present invention is to provide an interposer having a structure that is capable of efficiently mounting a plurality of functional elements having different sizes and that is excellent in handling convenience.

An electronic component according to a preferred embodiment of the present invention includes a first functional element that includes a first mounting surface on which a pair of first connecting electrode portions is formed, a pair of pillar electrodes that have a first upper surface and a first lower surface respectively, the first upper surface is connected to the corresponding first connecting electrode portion, a second functional element that is arranged in a space defined by the first mounting surface of the first functional element and the pair of pillar electrodes and that includes a second mounting surface on which a pair of second connecting electrode portions is formed, a pair of pad electrodes that have a second upper surface and a second lower surface respectively, the second upper surface is connected to the corresponding second connecting electrode portion, and a sealing resin that is formed in a region below the first mounting surface of the first functional element and seals the pair of pillar electrodes, the pair of pad electrodes and the second functional element so as to expose the first lower surfaces of the pair of pillar electrodes and the second lower surfaces of the pair of pad electrodes.

This electronic component has a structure in which the first functional element and the second functional element having different sizes each other are integrated in a laminated state. Therefore, the first functional element and the second functional element are not to be handled separately.

In addition, the first lower surfaces exposed from the sealing resin in the pair of pillar electrodes can be used as first mounting electrode surfaces. Similarly, the second lower surfaces exposed from the sealing resin in the pair of pad electrodes can be used as second mounting electrode surfaces.

Thereby, the first functional element and the second functional element can be mounted onto a mounting substrate in one step by bonding the first lower surfaces of the pair of pillar electrodes and the second lower surfaces of the pair of pad electrodes onto the mounting substrate.

Therefore, an electronic component having a structure that is capable of efficiently mounting a plurality of functional elements having different sizes and that is excellent in handling convenience can be provided.

A method for manufacturing an electronic component according to a preferred embodiment of the present invention includes a step of forming a pair of pillar electrodes at intervals on a substrate, a step of forming a pair of pad electrodes that have a thickness thinner than a thickness of the pair of pillar electrodes respectively at intervals in a space between the pair of pillar electrodes on the substrate, a step of mounting a small size functional element onto the pair of pad electrodes, a step of sealing the pair of pillar electrodes, the pair of pad electrodes and the small size functional element selectively by a sealing resin so that upper surfaces of the pair of pillar electrodes are exposed, a step of exposing lower surfaces of the pair of pillar electrodes and lower surfaces of the pair of pad electrodes by removing the substrate, and a step of mounting a large size functional element larger than the small size functional element onto the upper surfaces of the pair of pillar electrodes.

According to this manufacturing method, an electronic component having a structure in which the first functional element and the second functional element having different sizes each other are integrated in a laminated state can be manufactured. Thereby, the first functional element and the second functional element are not to be handled separately.

Further, according to this manufacturing method, the lower surfaces of the pair of pillar electrodes and the lower surfaces of the pair of pad electrodes are exposed from the sealing resin by removing the substrate. Therefore, the lower surfaces exposed from the sealing resin in the pair of pillar electrodes can be used as first mounting electrode surfaces. Similarly, the lower surfaces exposed from the sealing resin in the pair of pad electrodes can be used as second mounting electrode surfaces.

Thereby, the small size functional element and the large size functional element can be mounted onto a mounting substrate in one step by bonding the lower surfaces of the pair of pillar electrodes and the lower surfaces of the pair of pad electrodes onto the mounting substrate. Therefore, an electronic component having a structure that is capable of efficiently mounting a plurality of functional elements having different sizes and that is excellent in handling convenience can be manufactured and provided.

An interposer according to a preferred embodiment of the present invention includes a pair of pillar electrodes that have a first upper surface and a first lower surface respectively and that is arranged at intervals each other, a pair of pad electrodes that have a second upper surface and a second lower surface respectively and that is arranged at intervals each other in a space between the pair of pillar electrodes, a functional element that has a mounting surface on which a pair of connecting electrode portions is formed and that is mounted onto the pair of pad electrodes in the space such that the pair of connecting electrode portions is connected to the second upper surfaces of the pair of pad electrodes, and a sealing resin that seals the pair of pillar electrodes, the pair of pad electrodes and the functional element so as to expose the first upper surfaces of the pair of pillar electrodes, the first lower surfaces of the pair of pillar electrodes and the second lower surfaces of the pair of pad electrodes.

According to this interposer, the first lower surfaces exposed from the sealing resin in the pair of pillar electrodes can be used as first mounting electrode surfaces. Similarly, the second lower surfaces exposed from the sealing resin in the pair of pad electrodes can be used as second mounting electrode surfaces.

Thereby, the functional element can be mounted onto the mounting substrate simultaneously with the interposer by bonding the first mounting electrode surfaces and the second mounting electrode surfaces onto the mounting substrate. Moreover, the interposer has a connection area larger than a connection area of the functional element. Therefore, the functional element can be easily mounted onto the mounting substrate by using the relatively large connecting area of the interposer.

Further, this interposer has a structure in which the first upper surfaces of the pair of pillar electrodes are exposed from the sealing resin. The first upper surfaces of the pair of pillar electrodes can be used as mounting electrode surfaces whereon a functional element having a size larger than a size of the functional element sealed by the sealing resin can be mounted.

Thereby, the large size functional element can be bonded onto the first upper surfaces of the pair of pillar electrodes regardless of the arrangement of the small functional element sealed by the sealing resin. As a result, a structure where the large size functional element is laminated on the small size functional element in a 3D mounting state is to be efficiently realized.

Therefore, an interposer having a structure that is capable of efficiently mounting a plurality of functional elements having different sizes and that is excellent in handling convenience can be provided.

Hereinafter, a plurality of preferred embodiments according to the present invention is described in detail with reference to the accompanying drawings.

<First Preferred Embodiment>

Figure 2:
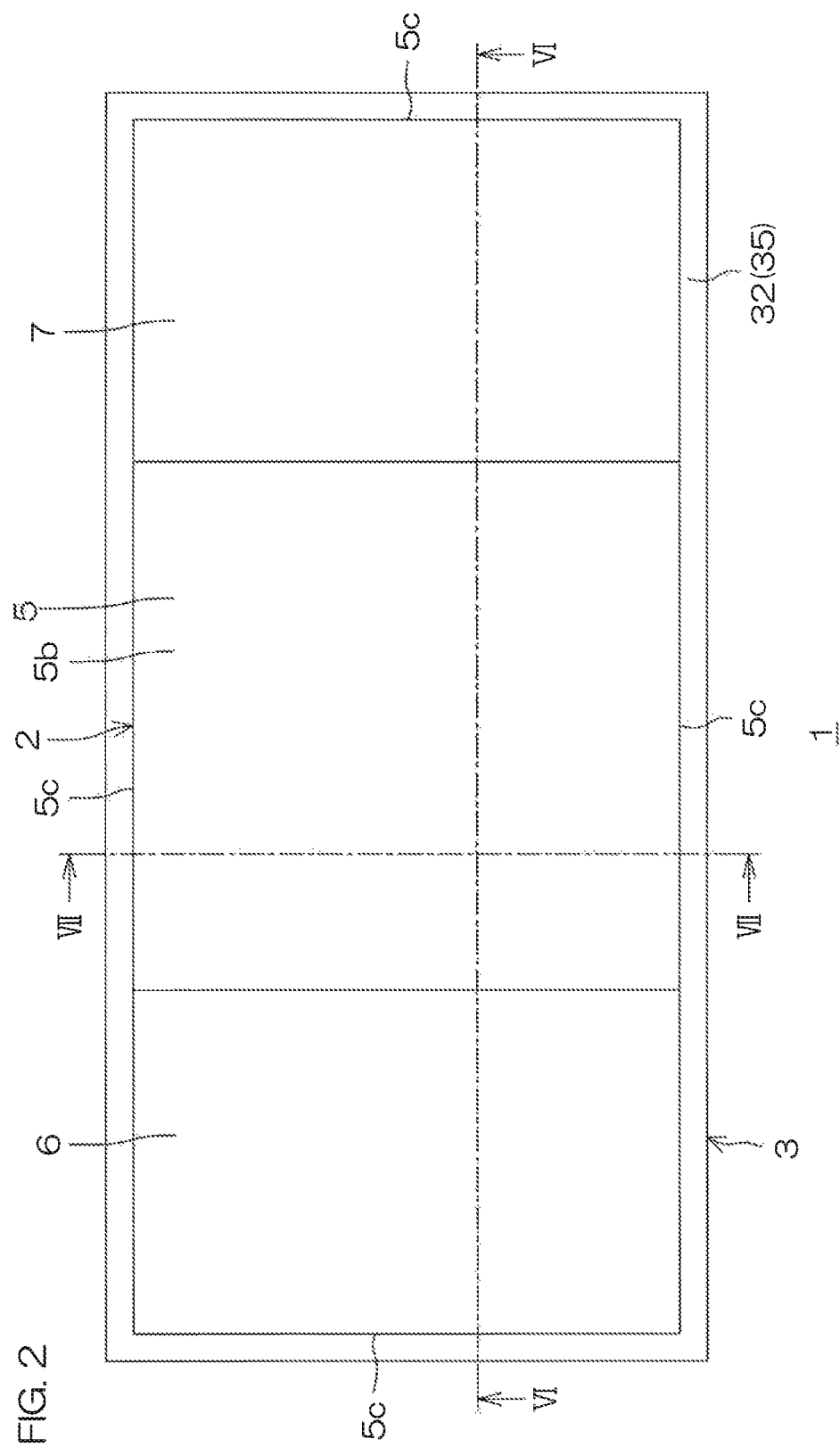
FIG. 2 is a plan view of the electronic component shown in FIG. 1.
Figure 3:
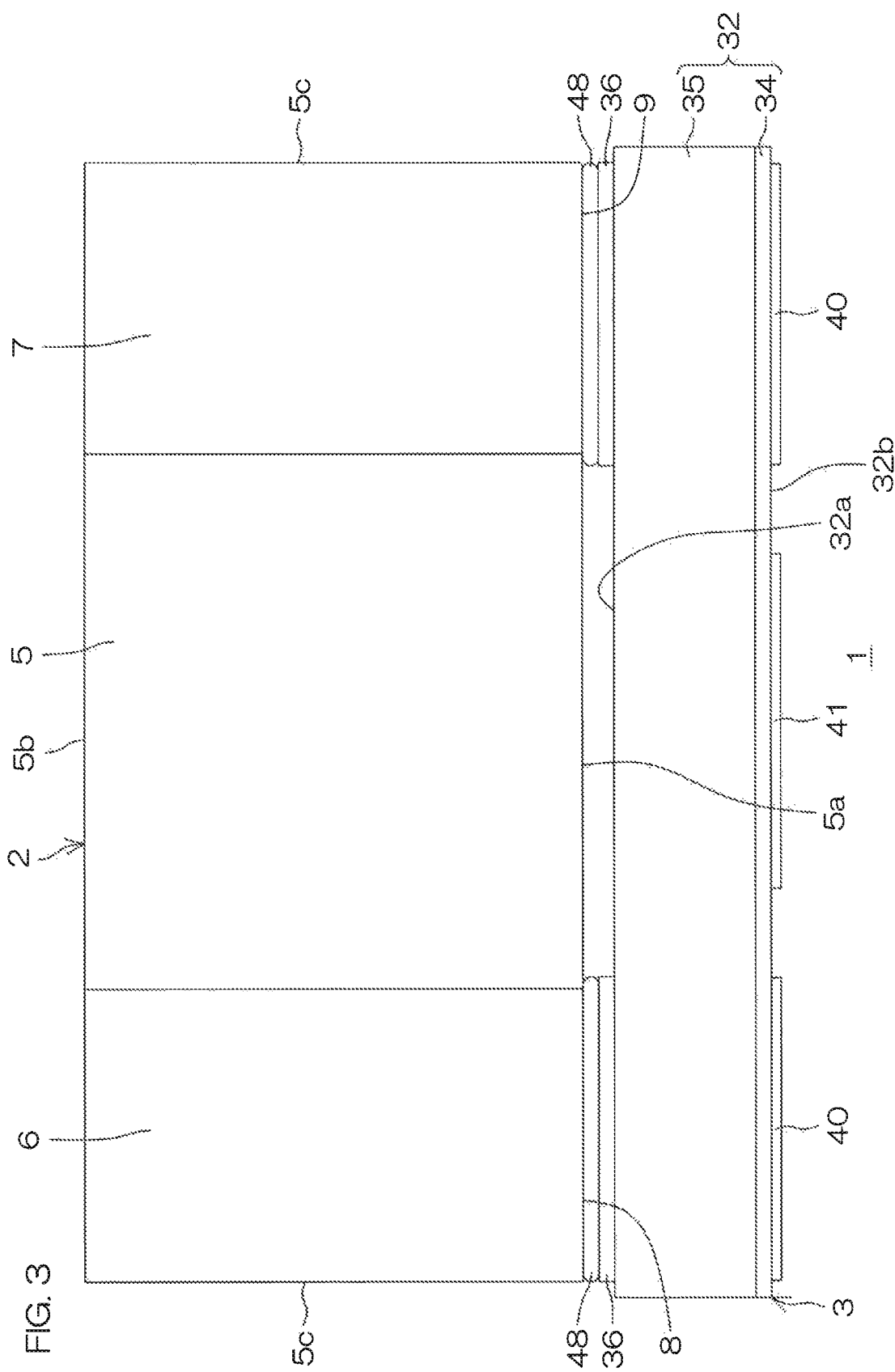
FIG. 3 is a front view of the electronic component shown in FIG. 1.
Figure 4:
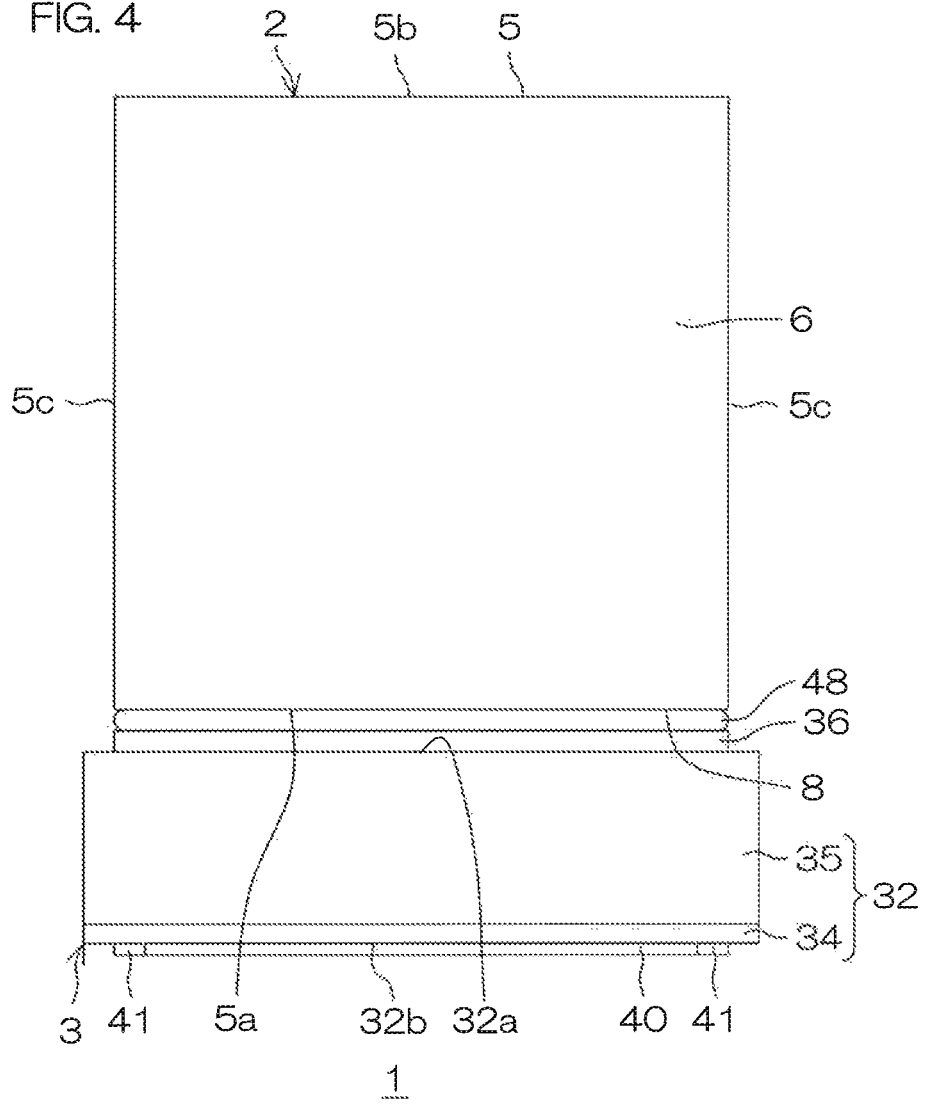
FIG. 4 is a side view of the electronic component shown in FIG. 1.
Figure 5:
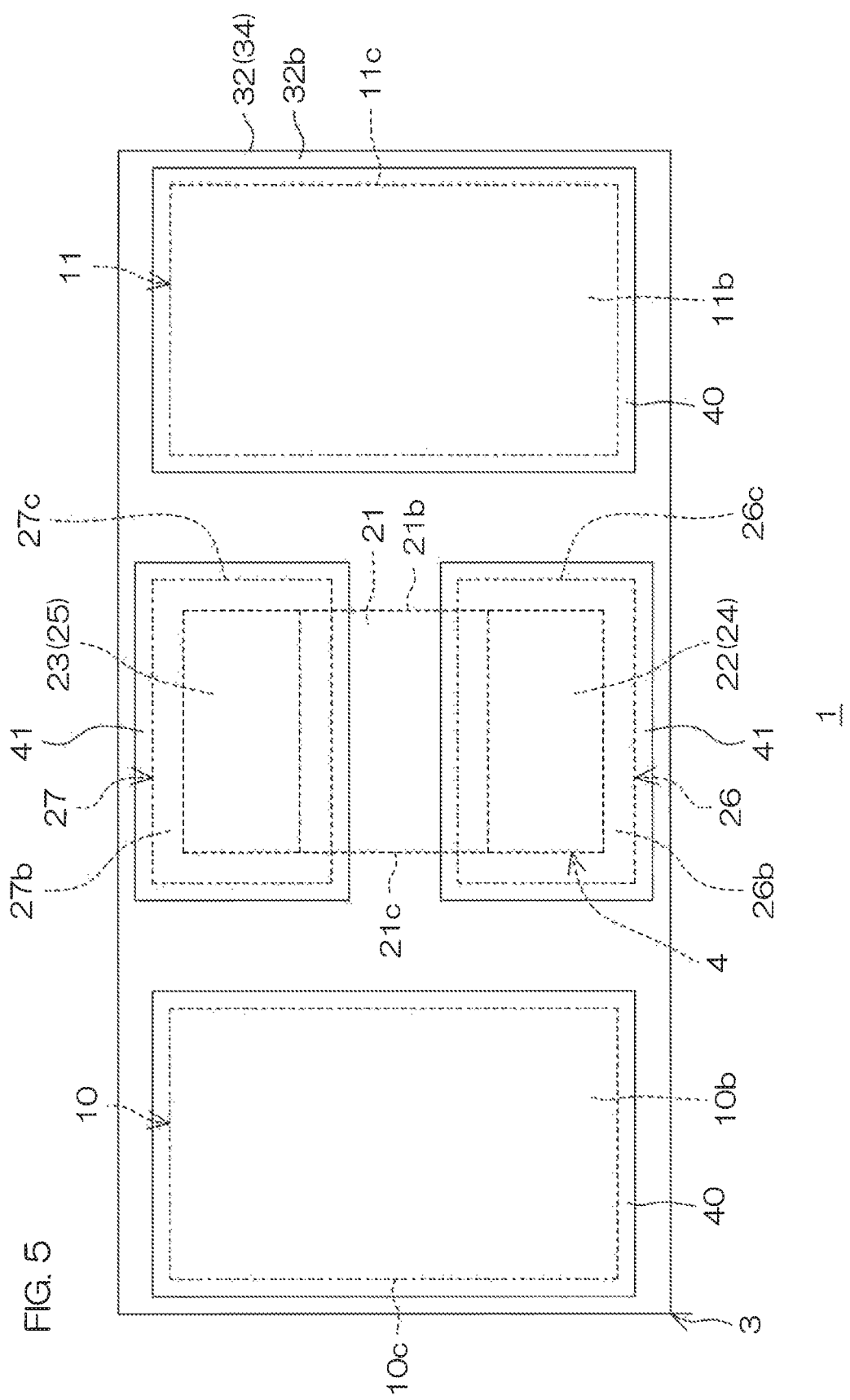
FIG. 5 is a bottom view of the electronic component shown in FIG. 1.

FIG. 1 is a perspective view of an electronic component 1 according to a first preferred embodiment of the present invention. FIG. 2 is a plan view of the electronic component 1 shown in FIG. 1. FIG. 3 is a front view of the electronic component 1 shown in FIG. 1. FIG. 4 is a side view of the electronic component 1 shown in FIG. 1. FIG. 5 is a bottom view of the electronic component 1 shown in FIG. 1.

Figure 6:
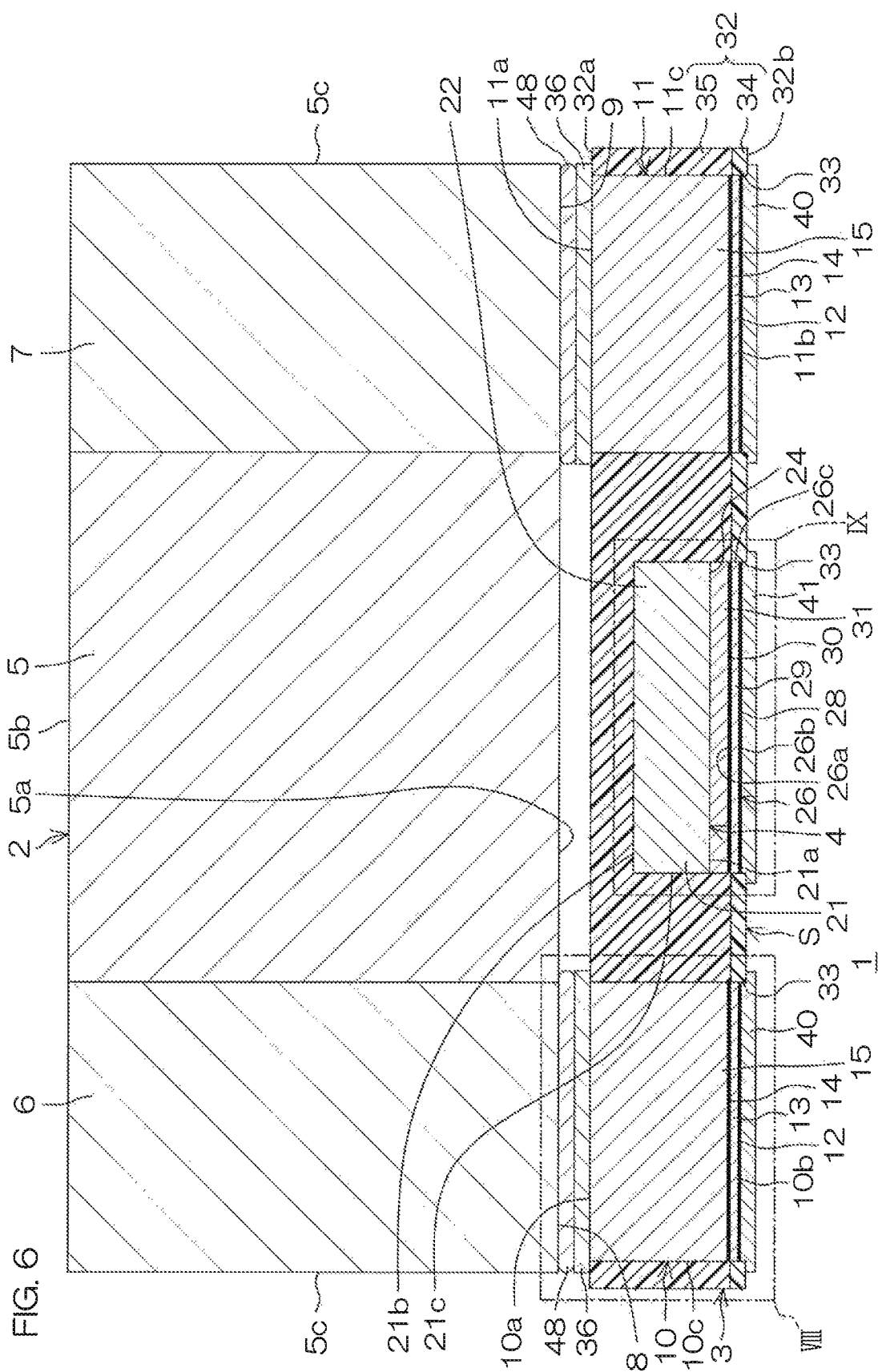
FIG. 6 is a cross-sectional view taken along the line VI-VI shown in FIG. 2.
Figure 7:
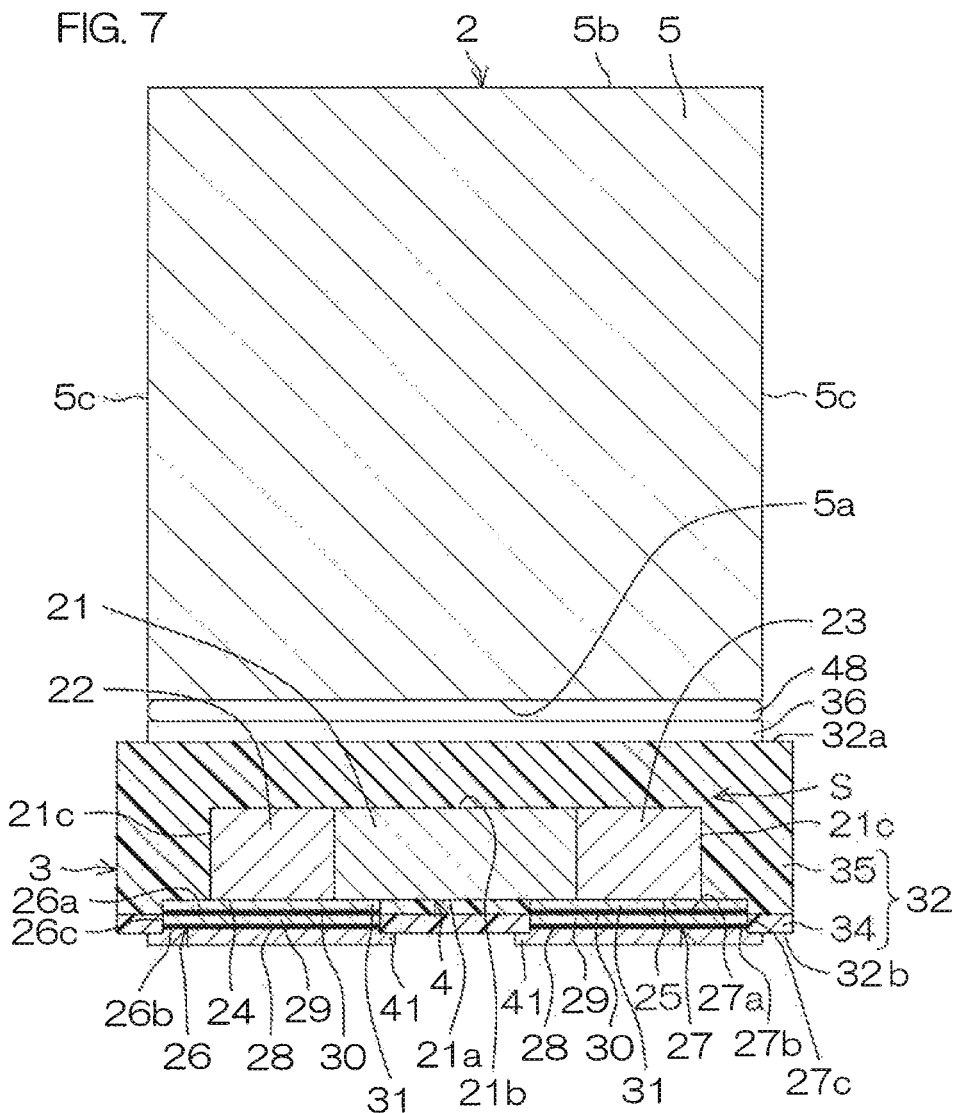
FIG. 7 is a cross-sectional view taken along the line VII-VII shown in FIG. 2.
Figure 8:
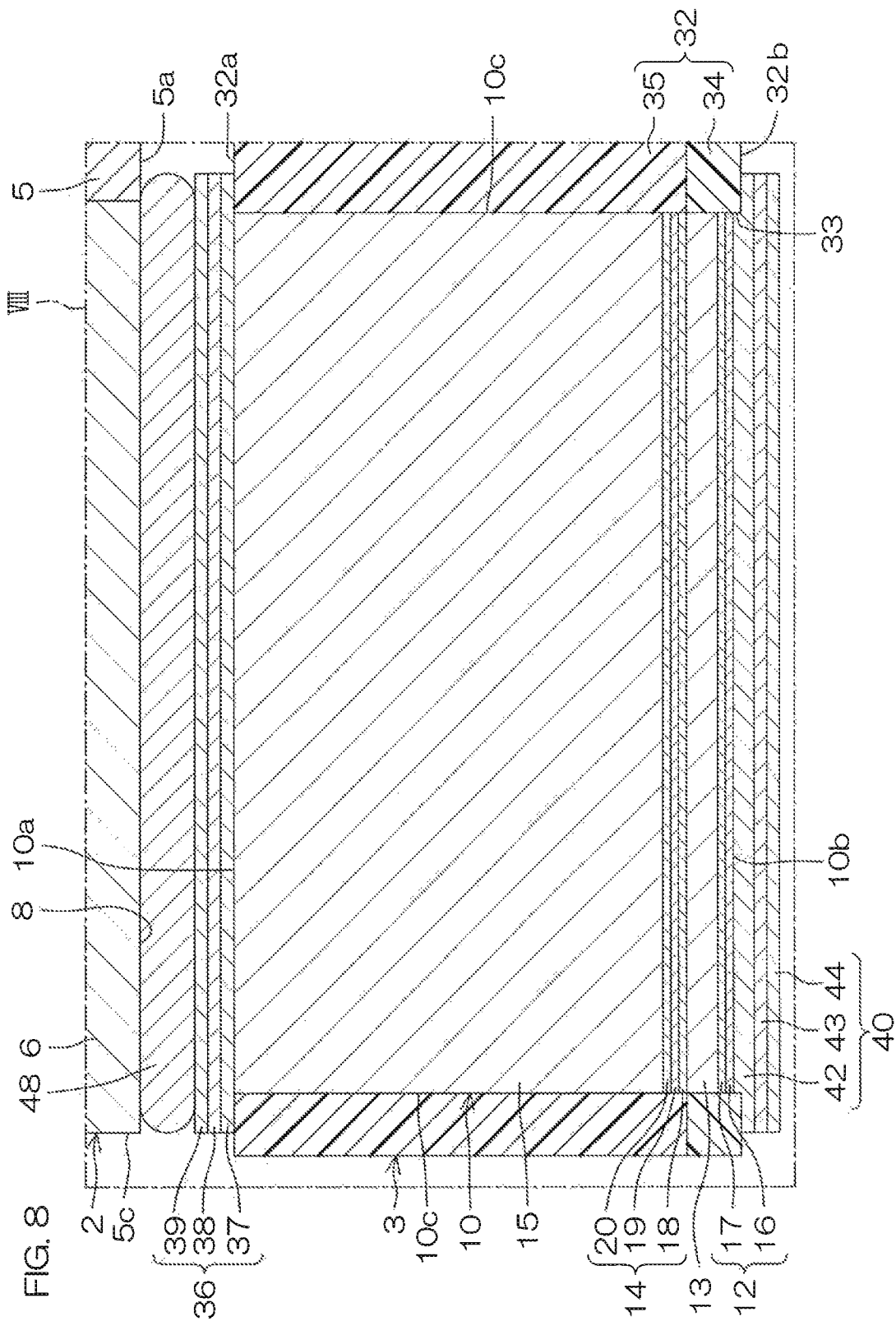
FIG. 8 is an enlarged view of a region VIII shown in FIG. 6.
Figure 9:
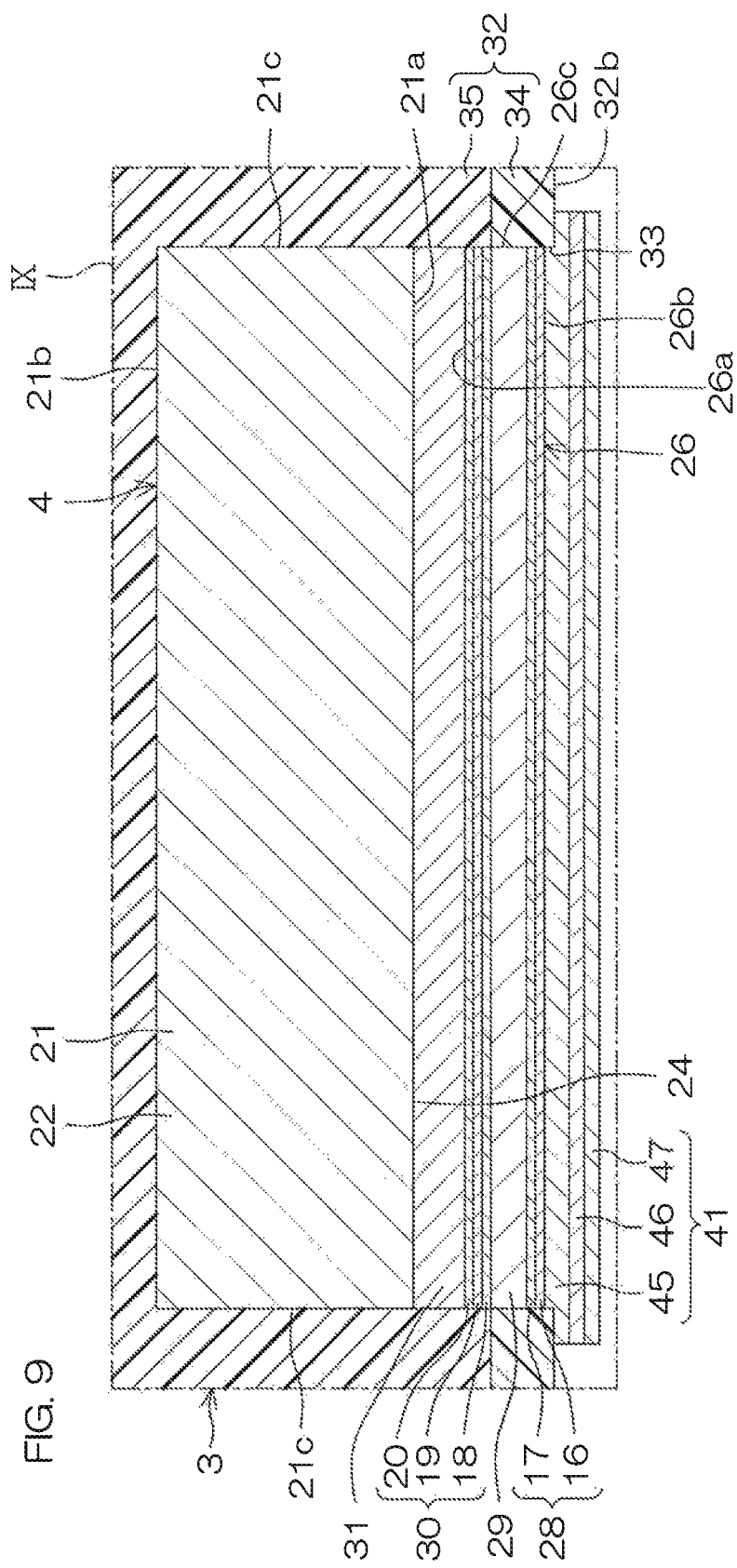
FIG. 9 is an enlarged view of a region IX shown in FIG. 6.

FIG. 6 is a cross-sectional view taken along the line VI-VI shown in FIG. 2. FIG. 7 is a cross-sectional view taken along the line VII-VII shown in FIG. 2. FIG. 8 is an enlarged view of a region VIII shown in FIG. 6. FIG. 9 is an enlarged view of a region IX shown in FIG. 6.

Referring to FIG. 1 to FIG. 9, the electronic component 1 includes a first functional element 2, an interposer 3 onto which the first functional element 2 is bonded, and a second functional element 4 arranged inside the interposer 3.

The first functional element 2 is a minute chip component referred to as a 0603 (0.6 mm×0.3 mm) chip, 0402 (0.4 mm×0.2 mm) chip, 03015 (0.3 mm×0.15 mm) or the like.

The first functional element 2 includes a first functional element body 5 having a rectangular parallelepiped shape. The first functional element body 5 may be made of an insulating material such as ceramics or the like. The first functional element body 5 may be made of a semiconductor material such as silicon or the like. Various elements such as a resistor, a capacitor, an inductor, and a diode may be adopted as the element formed in the first functional element body 5.

The first functional element body 5 includes a pair of first main surfaces 5a, 5b facing each other and a first lateral surface 5c connecting the pair of first main surfaces 5a, 5b. The first main surface 5a among the pair of first main surfaces 5a, 5b is a mounting surface that faces to the mounting substrate when the first functional element 2 is mounted. Hereinafter, one first main surface 5a is also referred to as a first mounting surface 5a.

A pair of first terminal electrodes 6, 7 is formed at both longitudinal ends of the first functional element body 5. In the present preferred embodiment, the first terminal electrodes 6, 7 respectively covers the first lateral surface 5c from three directions in addition to the pair of first main surfaces 5a, 5b of the first functional element body 5. The first terminal electrode 6 includes a first connecting electrode portion 8 to be externally connected. The first terminal electrode 7 includes a first connecting electrode portion 9 to be externally connected. The pair of first connecting electrode portion 8, 9 is formed on the first mounting surface 5a side.

The interposer 3 includes a pair of pillar electrodes 10, 11 respectively bonded onto the pair of first connecting electrode portions 8, 9 of the first functional element 2.

One pillar electrode 10 among the pair of pillar electrodes 10, 11 is bonded onto one first connecting electrode portion 8. The other pillar electrode is bonded onto the other first connecting electrode portion 9.

The pair of pillar electrodes 10, 11 respectively includes an upper surface 10a, 11a, a lower surface 10b, 11b positioned on an opposite side of the upper surface 10a, 11a, and a lateral surface 10c, 11c connecting the upper surface 10a, 11a and the lower surface 10b, 11b.

The upper surfaces 10a, 11a of the pair of pillar electrodes 10, 11 are bonded onto the corresponding first connecting electrode portions 8, 9. The lower surfaces 10b, 11b of the pair of pillar electrodes 10, 11 are formed as the first mounting electrode surfaces to be bonded onto the mounting substrate.

The pair of pillar electrodes 10, 11 is columnar or block-shaped electrodes. In the present preferred embodiment, the pair of pillar electrodes 10, 11 is formed in a rectangular parallelepiped shape that extends along the thickness direction of the first functional element 2. The thickness of the pair of pillar electrodes 10, 11 is, for example, equal to or greater than 100 μm and equal to or smaller than 300 μm (substantially 200 μm in the present preferred embodiment).

Referring to FIG. 8, the pair of pillar electrodes 10, 11 respectively includes a first seed layer 12, a first electrode layer 13, a second seed layer 14, and a second electrode layer 15 laminated in this order from the lower surfaces 10b, 11b side. The lower surfaces 10b, 11b of the pair of pillar electrodes 10, 11 are respectively formed by the first seed layer 12. The upper surfaces 10a, 11a of the pair of pillar electrodes 10, 11 are respectively formed by the second electrode layer 15.

Each of the first seed layers 12 has a laminated structure including a Cu layer 16 and a Ti layer 17 laminated in this order from the lower surfaces 10b, 11b side. The thickness of the first seed layer 12 is, for example, equal to or greater than 0.1 μm and equal to or smaller than 5 μm (substantially 1 μm in the present preferred embodiment).

Each of the first electrode layers 13 has a single layer structure including a Cu plating layer. The thickness of the first electrode layer 13 is, for example, equal to or greater than 80 μm and equal to or smaller than 240 μm (substantially 180 μm in the present preferred embodiment).

Each of the second seed layers 14 has a laminated structure including a Ti layer 18, a Cu layer 19 and a Ti layer 20 laminated in this order from the first electrode layer 13 side. The thickness of the second seed layer 14 is, for example, equal to or greater than 0.1 μm and equal to or smaller than 5 μm (substantially 1 μm in the present preferred embodiment).

Each of the second electrode layers 15 has a single layer structure including a Cu plating layer. The thickness of the second electrode layer 15 is, for example, equal to or greater than 10 μm and equal to or smaller than 50 μm (substantially 20 μm in the present preferred embodiment).

Each of the first seed layers 12 may have a single layer structure including only the Cu layer 16 or only the Ti layer 17. Each of the second seed layers 14 may have a two-layer structure including the Ti layer 18 and the Cu layer 19 laminated in this order from the first electrode layer 13 side. In a case where each of the second seed layers 14 has the two-layer structure, the second electrode layers 15 may be integrally formed with the Cu layers 19 of the second seed layers 14.

A space S is defined in a region between the first mounting surface 5a of the first functional element 2 and the pair of pillar electrodes 10, 11. The space S is also a space sandwiched by the pair of pillar electrodes 10, 11.

The second functional element 4 is arranged in the space S defined inside the interposer 3. That is, the interposer 3 includes the second functional element 4 arranged in the space S. The second functional element 4 is a small chip component having a size smaller than the size of the first functional element 2.

Referring to FIG. 5 to FIG. 7, the second functional element 4 includes a second functional element body 21 having a rectangular parallelepiped shape. The second functional element body 21 may be made of an insulating material such as ceramics or the like. The second functional element body 21 may be made of a semiconductor material such as silicon or the like. Various elements such as a resistor, a capacitor, an inductor and a diode may be adopted as the element formed in the second functional element body 21.

The second functional element body 21 includes a pair of second main surfaces 21a, 21b facing each other and a second lateral surface 21c connecting the pair of second main surfaces 21a, 21b. The second main surface 21a among the pair of second main surfaces 21a, 21b is a mounting surface that faces to the mounting substrate when the second functional element 4 is mounted. Hereinafter, one second main surface 21a is also referred to as a second mounting surface 21a.

The second mounting surface 21a of the second functional element 4 has an area smaller than an area of the first mounting surface 5a of the first functional element 2. The second functional element 4 has a thickness smaller than a thickness of the pair of pillar electrodes 10, 11. The other second main surface 21b of the second functional element 4 is positioned in a region below the upper surfaces 10a, 11a of the pair of pillar electrodes 10, 11.

A pair of second terminal electrodes 22, 23 is formed at both longitudinal ends of the second functional element body 21. In the present preferred embodiment, the pair of second terminal electrodes 22, 23 respectively covers the second lateral surface 21c form three directions in addition to the pair of second main surfaces 21a, 21b of the second functional element body 21. The second terminal electrode 22 includes a second connecting electrode portion to be externally connected. The second terminal electrode 23 includes a second connecting electrode portion 24 to be externally connected. The pair of second terminal electrodes 22, 23 is formed on the second mounting surface 21a side.

A pair of pad electrodes 26, 27 is arranged in the space S defined inside the interposer 3. That is, the interposer 3 includes the pair of pad electrodes 26, 27 arranged in the space S. The pair of pad electrodes 26, 27 is bonded onto the corresponding second connecting electrode portions 24, 25 of the second functional element 4.

One pad electrode 26 among the pair of pad electrodes 26, 27 is bonded onto one second connecting electrode portion 24. The other pad electrode 27 is bonded onto the other second connecting electrode portion 25.

The pair of pad electrodes 26, 27 respectively includes an upper surface 26a, 27a, a lower surface 26b, 27b positioned on an opposite side of the upper surface 26a, 27a, and a lateral surface 26c, 27c connecting the upper surface 26a, 27a and the lower surface 26b, 27b.

The upper surfaces 26a, 27a of the pair of pad electrodes 26, 27 are bonded onto the corresponding second connecting electrode portions 24, 25. The lower surfaces 26b, 27b of the pair of pad electrodes 26, 27 are formed as the second mounting electrode surfaces to be bonded onto the mounting substrate.

A thickness of the pair of pad electrodes 26, 27 is, for example, substantially 1/10 of the thickness of the pair of pillar electrodes 10, 11. The thickness of the pair of pad electrodes 26, 27 is, for example, equal to or greater than 10 μm and equal to or smaller than 30 μm (substantially 20 μm in the present preferred embodiment).

Referring to FIG. 9, the pair of pad electrodes 26, 27 respectively includes a first pad seed layer 28, a pad electrode layer 29 and a second pad seed layer 30 laminated in this order from the lower surface 26b, 27b side.

Each of the first pad seed layers 28 is formed in the substantially same structure as the first seed layers 12. That is, each of the first pad seed layers 28 is made of same material as the material of the first seed layers 12 and has a substantially same thickness as the thickness of the first seed layers 12.

Each of the pad electrode layers 29 is formed in the substantially same structure as the first electrode layers 13. That is, each of the pad electrode layers 29 is made of same material as the material of the first electrode layers 13 and has a substantially same thickness as the thickness of the first electrode layers 13.

Each of the second pad seed layers 30 is formed in the substantially same structure as the second seed layers 14. That is, each of the second pad seed layers 30 is made of same material as the material of the second seed layers 14 and has a substantially same thickness as the thickness of the second seed layers 14.

Referring to FIG. 5 to FIG. 7, the pair of pad electrodes 26, 27 is arranged at intervals each other along an intersecting direction in which an opposing direction of the pair of pad electrodes 26, 27 intersects an opposing direction of the pair of pillar electrodes 10, 11. The intersecting direction is also an orthogonal direction in which the opposing direction of the pair of pad electrodes 26, 27 is orthogonal to the opposing direction of the pair of pillar electrodes 10, 11. Therefore, the second functional element 4 is arranged such that an opposing direction of the pair of second connecting electrode portions 24, 25 intersects an opposing direction of the pair of first connecting electrode portions 8, 9 of the first functional element 2 in a plan view. The second functional element 4 is entirely overlapped by the first functional element 2 in a plan view.

The pair of second connecting electrode portions 24, 25 of the second functional element 4 is respectively bonded onto the corresponding pad electrodes 26, 27 via a first conductive bonding material 31. The first conductive bonding material 31 include, for example, a Lead-free solder.

The first conductive bonding material 31 may include at least one of an SnAgCu based solder, an SnZnBi based solder, an SnCu based solder, an SnCuNi based solder or an SnSbNi based solder.

The SnAgCu based solder includes Sn (tin), Ag (silver) and Cu (copper). The SnZnBi based solder includes Sn (tin), Zn (zinc) and Bi (bismuth). The SnCu based solder includes Sn (tin) and Cu (copper). The SnCuNi based solder contains Sn (tin), Cu (copper) and Ni (nickel). The SnSbNi based solder includes Sn (tin), Sb (antimony) and Ni (nickel).

Referring to FIG. 1 to FIG. 9, the interposer 3 includes a sealing resin 32. The sealing resin 32 seals the pair of pillar electrodes 10, 11, the pair of pad electrodes 26, 27 and the second functional element 4 in a region below the first mounting surface 5a of the first functional element 2. That is, the outer surface of the first functional element 2 is exposed from the sealing resin 32. The sealing resin 32 is formed in a rectangular parallelepiped shape. The sealing resin 32 includes an upper surface 32a and a lower surface 32b.

The sealing resin 32 covers the pair of pillar electrodes 10, 11 such that the upper surfaces 10a, 11a and the lower surfaces 10b, 11b of the pair of pillar electrodes 10, 11 are exposed.

The upper surfaces 10a, 11a of the pair of pillar electrodes 10, 11 are exposed from the upper surface 32a of the sealing resin 32. The upper surface 32a of the sealing resin 32 is connected to the upper surfaces 10a, 11a of the pair of pillar electrodes 10, 11 without a step. The lower surfaces 10b, 11b of the pair of pillar electrodes 10, 11 are exposed from the lower surface 32b of the sealing resin 32.

The sealing resin 32 covers an outer surface of the second functional element 4 except junction portions between the second functional element 4 and the pair of pad electrodes 26, 27. The lower surfaces 26b, 27b of the pair of pad electrodes 26, 27 are exposed from the lower surface 32b of the sealing resin 32.

The lower surfaces 10b, 11b of the pair of pillar electrodes 10, 11 and the lower surfaces 26b, 27b of the pair of pad electrodes 26, 27 are formed so as to be recessed by one step from the lower surface 32b of the sealing resin 32 toward the upper surface 32a of the sealing resin 32. Thereby, recess portions 33 are formed in portions between the lower surfaces 10b, 11b of the pair of pillar electrodes 10, 11 and the lower surface 32b of the sealing resin 32, and portions between the lower surfaces 26b, 27b of the pair of pad electrodes 26, 27 and the lower surface 32b of the sealing resin 32.

Referring to FIG. 8 and FIG. 9, the sealing resin 32 includes a first sealing resin 34 and a second sealing resin 35 laminated in this order from the lower surface 32b side. The lower surface 32b of the sealing resin 32 is formed by the first sealing resin 34. the upper surface 32a of the sealing resin 32 is formed by the second sealing resin 35.

The first sealing resin 34 and the second sealing resin 35 may be made of same resin material. The first sealing resin 34 and the second sealing resin 35 may be made of different resin materials. The first sealing resin 34 and the second sealing resin 35 include, for example, a polyimide resin or an epoxy resin.

The first sealing resin 34 covers lateral surfaces of the first seed layers 12, lateral surfaces of the first electrode layers 13, lateral surfaces of the first pad seed layers 28, and lateral surfaces of the pad electrode layers 29.

The upper surface of the first sealing resin 34 is connected to the upper surfaces of the first electrode layers 13 without a step. The upper surfaces of the first electrode layers 13 are formed flat. The second seed layers 14 and the second electrode layers 15 are formed on the flat upper surface of the first electrode layers 13. Therefore, the second seed layers 14 and the second electrode layers 15 having satisfactory film forming properties with respect to the first electrode layers 13 are formed.

The upper surface of the first sealing resin 34 is connected to the upper surfaces of the pad electrode layers 29 without a step. The upper surfaces of the pad electrode layers 29 are formed flat. The second pad seed layers 30 and the first conductive bonding materials 31 are formed on the flat upper surfaces of the pad electrode layers 29. Therefore, the second pad seed layers 30 and the first conductive bonding materials 31 having satisfactory film forming properties with respect to the pad electrode layers 29 are formed.

The second sealing resin 35 covers lateral surfaces of the second seed layers 14, lateral surfaces of the second electrode layers 15, lateral surfaces of the second pad seed layers 30, an outer surface of the first conductive bonding materials 31 and the outer surface of the functional element 4.

The interposer 3 includes a pair of upper surface electrode layers 36, a pair of first lower surface electrode layers 40, and a pair of second lower surface electrode layers 41.

The pair of upper surface electrode layers 36 respectively covers the upper surfaces 10a, 11a of the pair of pillar electrodes 10, 11. The pair of upper surface electrode layers 36 is formed such that a part thereof is overlapped onto the upper surface 32a of the sealing resin 32. The pair of upper surface electrode layers 36 includes a laminated structure having a Ni layer 37, a Pd layer 38 and an Au layer 39 laminated in this order from the pair of pillar electrodes 10, 11 side.

The pair of first lower surface electrode layers 40 respectively covers the lower surfaces 10b, 11b of the pair of pillar electrodes 10, 11. The pair of first lower surface electrode layers 40 is formed such that a part thereof is overlapped onto the lower surface 32b of the sealing resin 32. The pair of first lower surface electrode layers 40 includes a laminated structure having a Ni layer 42, a Pd layer 43 and an Au layer 44 laminated in this order from the pair of pillar electrodes 10, 11 side.

The pair of second lower surface electrode layers 41 respectively covers the lower surfaces 26*b*, 27*b* of the pair of pad electrodes 26, 27. The pair of second lower surface electrode layers 41 is formed such that a part thereof is overlapped onto the lower surface 32*b* of the sealing resin 32. The pair of second lower surface electrode layers 41 includes a laminated structure having a Ni layer 45, a Pd layer 46 and an Au layer 47 laminated in this order from the pair of pad electrodes 26, 27 side.

The pair of first connecting electrode portions 8, 9 of the first functional element 2 are respectively bonded onto the pair of upper surface electrode layers 36 via a second conductive bonding material 48, respectively. The same material as the first conductive bonding material 31 can be applied as a material of the second conductive bonding material 48, for example.

<Manufacturing Method of the Electronic Component 1>

Figure 10A:
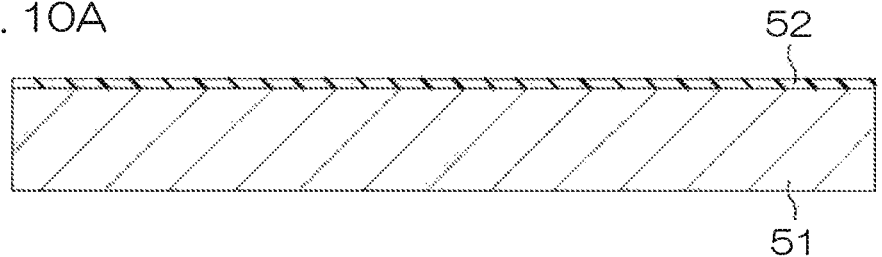
FIG. 10A to FIG. 10N are cross-sectional views showing steps of manufacturing the electronic component shown in FIG. 1.

FIG. 10A to FIG. 10N are cross-sectional views showing steps of manufacturing the electronic component 1 shown in FIG. 1. In FIG. 10A to FIG. 10N, an area where one of electronic components 1 is to be formed is taken out and shown, although a plurality of electronic components 1 is simultaneously manufactured in the manufacturing process of the electronic component 1.

First, referring to FIG. 10A, a substrate 51 is prepared. The substrate 51 is made of a removable material to be removed during the following process. A grinding process, an etching process or a peeling process is included in the removing process of the substrate 51.

Any materials are applicable as the material of the substrate 51 as long as it can be removed. The substrate 51 may include a silicon substrate, a metal substrate or the like. A copper substrate, a stainless steel substrate or the like can be exemplified as the metal substrate. In the present preferred embodiment, an example in which the substrate 51 includes a silicon substrate and is removed by the grinding process or the etching process during the following process is described.

Next, a nitride film 52 is formed on the upper surface of the substrate 51. The nitride film 52 is formed by depositing SiN (silicon nitride) on the upper surface of the substrate 51 by a CVD (Chemical Vapor Deposition) method, for example.

Figure 10B:
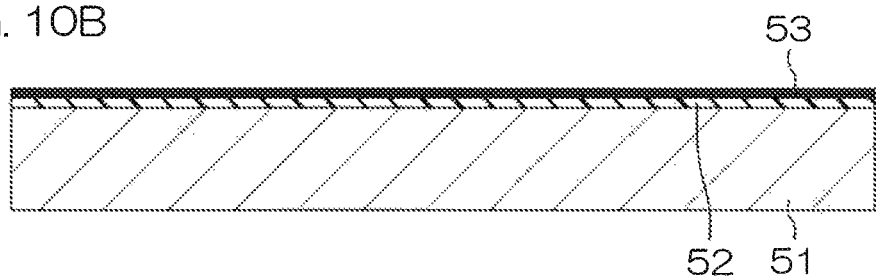

Next, referring to FIG. 10B, a first seed layer 53 that includes a Ti layer (not shown), the Cu layer 16 and the Ti layer 17 (see also FIG. 8 and FIG. 9) is formed. The first seed layer 53 is formed by depositing Ti, Cu, Ti on the nitride film 52 in this order by a sputtering method, for example.

Figure 10C:
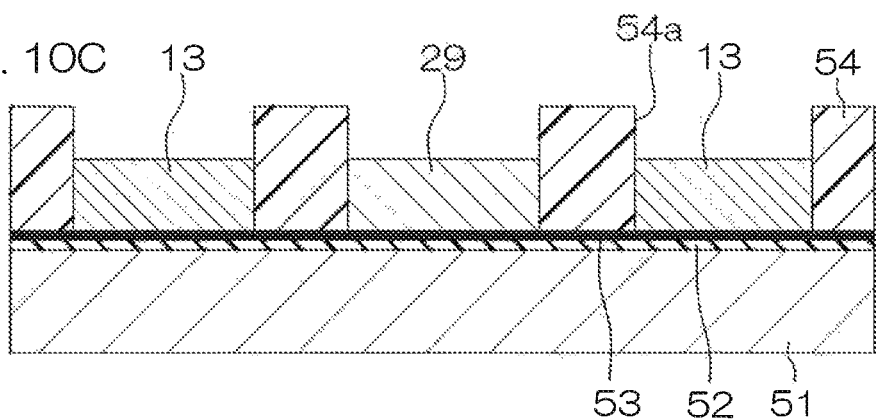

Next, referring to FIG. 10C, a resist mask 54 that has predetermined pattern is formed on the first seed layer 53. The resist mask 54 has openings 54*a* that selectively expose regions where the pair of pillar electrodes 10, 11 and the pair of pad electrodes 26, 27 are to be formed.

Next, the first electrode layers 13 and the pad electrode layers 29 are formed on the first seed layer 53 exposed from the openings 54*a* of the resist mask 54. The first electrode layers 13 and the pad electrode layers 29 are formed by depositing Cu on the first seed layer 53 by an electrolytic plating method, for example. The resist mask 54 is removed after the first electrode layers 13 and the pad electrode layers 29 are formed.

In this step, the first electrode layers 13 including Cu and the pad electrode layers 29 including Cu are formed on the Ti layer 17 of the first seed layer 53. Cu typically has a relatively high affinity with respect to Ti. Therefore, an adhesion between the first electrode layers 13 and the Ti layer 17, and, an adhesion between the pad electrode layers 29 and the Ti layer 17 can be enhanced.

Figure 10D:
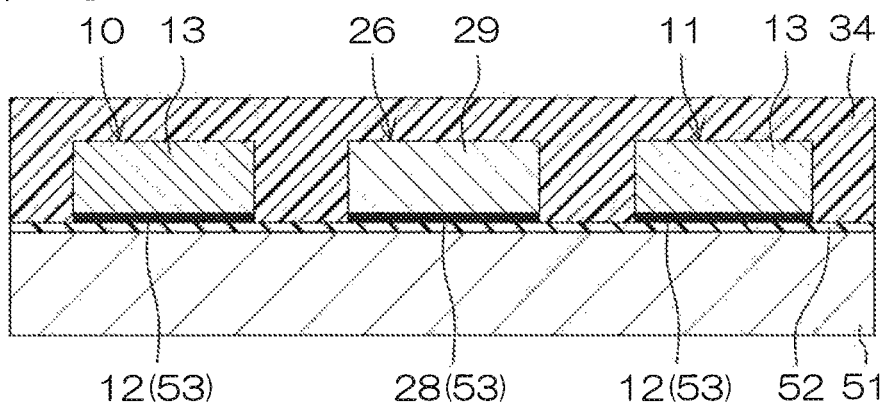

Next, referring to FIG. 10D, the first seed layers 12 and the first pad seed layers 28 are formed by removing unnecessary portions of the first seed layer 53. In this step, an etching method in which the first electrode layers 13 and the pad electrode layers 29 are used as masks is performed. The first seed layers 12 and the first pad seed layers 28 are formed by the remaining portions of the first seed layer 53.

Thereby, the first seed layers 12 and the first electrode layers 13 to be a part of the pair of pillar electrodes 10, 11 are formed. In addition, the first pad seed layers 28 and the pad electrode layers 29 to be a part of the pair of pad electrodes 26, 27 are formed.

Next, the first sealing resin 34 is supplied onto the substrate 51. The pair of pillar electrodes 10, 11 and the pair of pad electrodes 26, 27 are entirely covered with the first sealing resin 34.

Figure 10E:
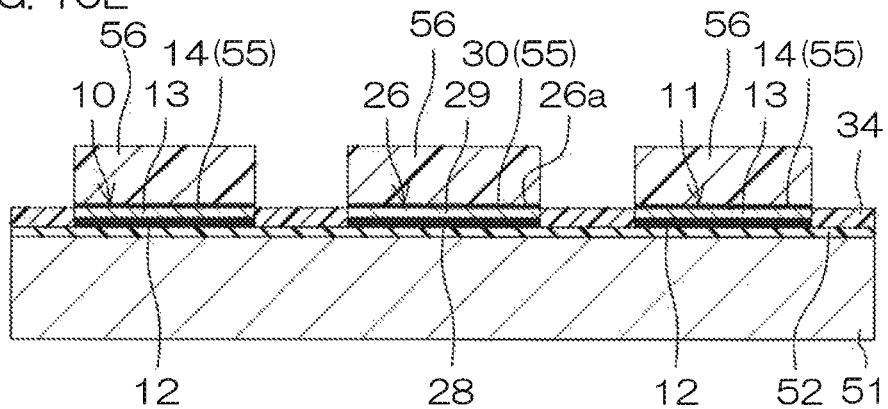

Next, referring to FIG. 10E, the upper surface of the first sealing resin 34 is ground. The upper surface of the first sealing resin 34 is ground by a CMP (Chemical Mechanical Polishing) method in which a polishing agent (abrasive grains) is used, for example. The grinding step is performed until upper surfaces of the pair of first electrode layers 13 and the upper surfaces of the pair of pad electrode layers 29 are exposed.

The grinding step includes a thinning step of thinning the thickness of the first sealing resin 34. In this step, the upper surface of the first sealing resin 34 is ground until the thickness of the pair of first electrode layers 13 and the thickness of the pair of pad electrode layers 29 reach a predetermined thickness.

Next, for example, polishing agent (abrasive grains) adhering to the upper surfaces of the pair of first electrode layers 13 and the upper surfaces of the pair of pad electrode layers 29 are removed by a cleaning method in which a chemical solution is used. This cleaning step also includes a step of removing copper oxide formed on the upper surfaces of the pair of first electrode layers 13 and the upper surfaces of the pair of pad electrode layers 29.

Next, a second seed layer 55 that includes the Ti layer 18, the Cu layer 19 and the Ti layer 20 is formed on the first sealing resin 34 (see also FIG. 8 and FIG. 9). The second seed layer 55 is formed so as to cover the upper surfaces of the pair of first electrode layers 13 and the upper surfaces of the pair of pad electrode layers 29. The step of forming the second seed layer 55 includes the step of depositing Ti, Cu, Ti from the first sealing resin 34 side in this order by a sputtering method, for example.

Next, a resist mask 56 having a predetermined pattern is formed on the first sealing resin 34. The resist mask 56 selectively covers the upper surfaces of the pair of first electrode layers 13 and the upper surfaces of the pair of pad electrode layers 29.

Next, unnecessary portions of the second seed layer 55 are removed by an etching methods through the resist mask 56, for example. Thereby, the second seed layers 14 and the second pad seed layers 30 are formed by remaining portions of the second seed layer 55 (see also FIG. 8 and FIG. 9). The resist mask 56 is removed after the second seed layers 14 and the second pad seed layers 30 are formed.

Figure 10F:
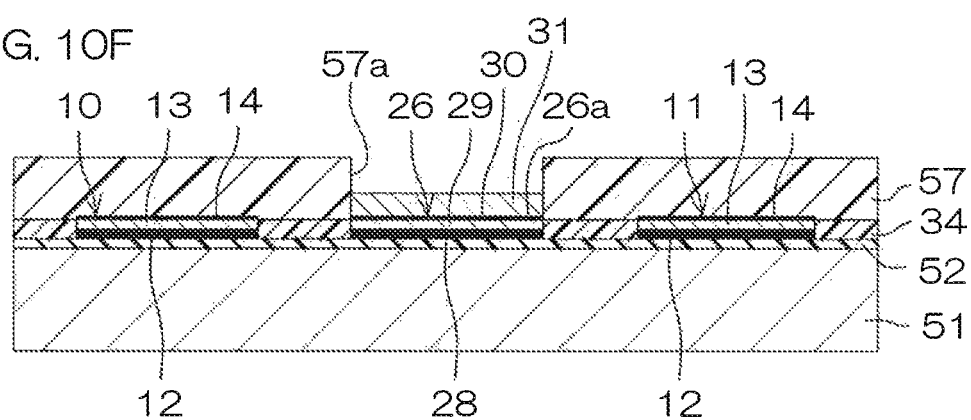

Next, referring to FIG. 10F, a resist mask 57 that has a predetermined pattern is formed on the first sealing resin 34. The resist mask 57 covers the pair of second seed layers 14. The resist mask 57 selectively has openings 57*a* that expose the pair of second pad seed layers 30.

Next, solder is deposited on the second pad seed layers 30 exposed from the openings 57a of the resist mask 57 by an electrolytic plating method, for example. Thereby, the first conductive bonding materials 31 are formed. The solder may be an SnCuNi based solder. The resist mask 57 is removed after the step of forming the first conductive bonding materials 31.

Figure 10G:
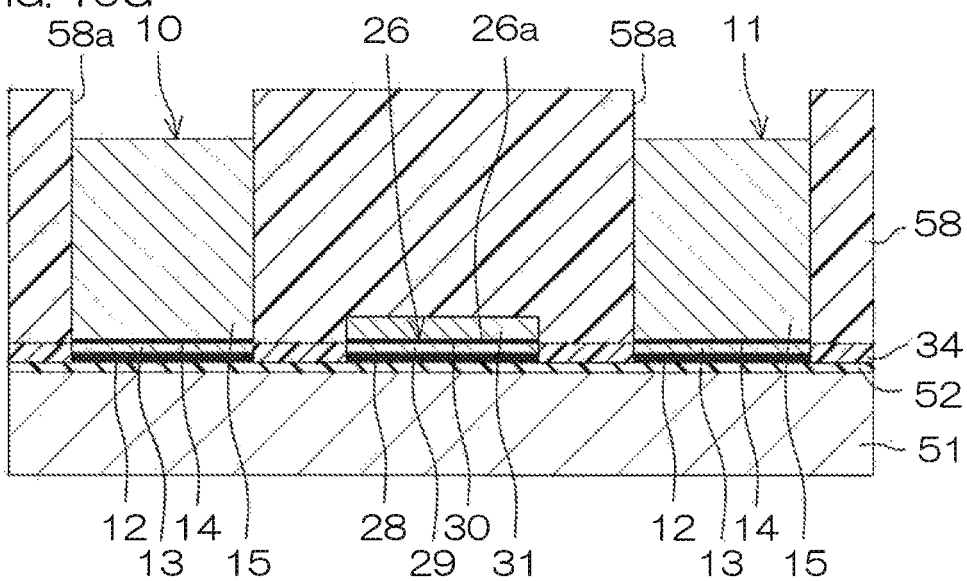

Next, referring to FIG. 10G, a resist mask 58 having a predetermined pattern is formed on the first sealing resin 34. The resist mask 58 covers the pair of second pad seed layers 30. The resist mask 58 selectively has openings 58a that expose the pair of second seed layers 14.

Next, Cu is deposited on the second seed layers 14 exposed from the openings 58a of the resist mask 58 by an electrolytic plating method, for example. In this way, the second electrode layers 15 are formed. The resist mask 58 is removed after the second electrode layers 15 are formed.

Thereby, the pair of pillar electrodes 10, 11 that have a laminated structure including the first seed layer 12, the first electrode layer 13, the second seed layer 14 and the second electrode layer 15 respectively is formed (see also FIG. 8).

In the step of forming the second electrode layers 15, the second electrode layers 15 including Cu are formed on the Ti layers 20 of the second seed layers 14. Cu typically has a relatively high affinity with respect to Ti. Therefore, an adhesion between the second electrode layers 15 and the Ti layers 20 can be enhanced.

Figure 10H:
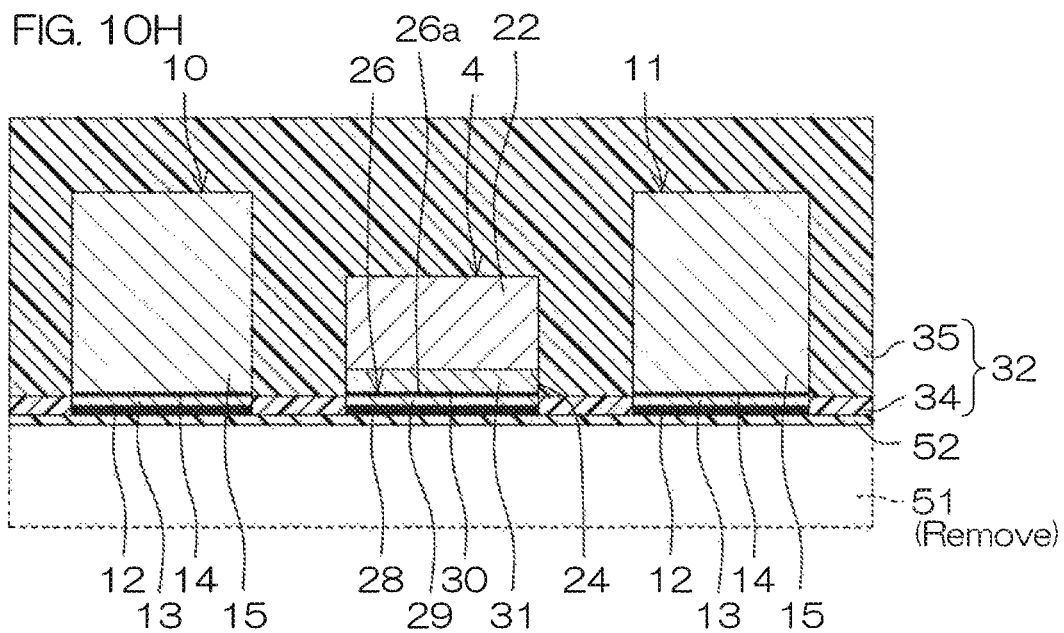

Next, referring to FIG. 10H, the second functional element 4 is bonded onto the pair of pad electrodes 26, 27. One second connecting electrode portion 24 of the second functional element 4 is bonded onto the upper surface 26a of one pad electrode 26 via the first conductive bonding material 31. The other second connecting electrode portion 25 of the second functional element 4 is bonded onto the upper surface 27a of the other pad electrode 27 via the first conductive bonding material 31.

The first conductive bonding materials 31 may be previously formed on the pair of second connecting electrode portions 24, 25 of the second functional element 4. In this case, the step of forming the first conductive bonding materials 31 on the pad electrodes 26 and 27 can be omitted.

However, in this case, the first conductive bonding materials 31 are to be formed on the second connecting electrode portions 24, 25 of the relatively small second functional element 4. Therefore, it is easier to form the first conductive bonding materials 31 on the upper surfaces 26a, 27a of the pair of pad electrodes 26, 27.

Next, the second sealing resin 35 is supplied onto the substrate 51. The pair of pillar electrodes 10, 11, the pair of pad electrodes 26, 27 and the second functional element 4 are entirely covered with the second sealing resin 35. Through this step, the sealing resin 32 including the first sealing resin 34 and the second sealing resin 35 is formed.

Next, the substrate 51 is removed. The substrate 51 is removed through the removing step such as the grinding process by a CMP method or the etching process.

Figure 10I:
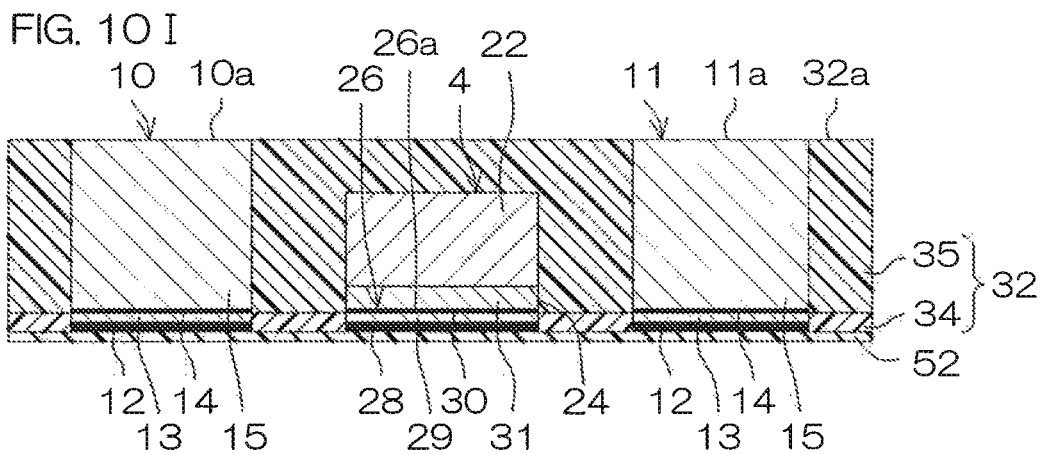

Next, referring to FIG. 10I, the upper surface 32a of the sealing resin 32 is ground by a CMP method, for example. This grinding step is performed until the upper surfaces 10a, 11a of the pair of pillar electrodes 10, 11 are exposed.

This grinding step includes a thinning step of thinning the thickness of the sealing resin 32. In this step, the upper surface 32a of the sealing resin 32 is ground until the thickness of the pillar electrodes 10, 11 reach a predetermined thickness.

The upper surfaces 10a, 11a of the pair of pillar electrodes 10, 11 and the upper surface 32a of the sealing resin 32 are flattened by the grinding step of the sealing resin 32. Thereby, the upper surfaces 10a, 11a of the pair of pillar electrodes 10, 11 are connected to the upper surface 32a of the sealing resin 32 without a step.

The removing step of the substrate 51 may be performed after the grinding step of the sealing resin 32. The polishing agent (abrasive grains) adhering to the upper surfaces 10a, 11a of the pair of pillar electrodes 10, 11 may be removed by a cleaning method in which a chemical solution is used. This cleaning step may include a step of removing copper oxide formed on the upper surfaces 10a, 11a of the pair of pillar electrodes 10, 11.

Figure 10J:
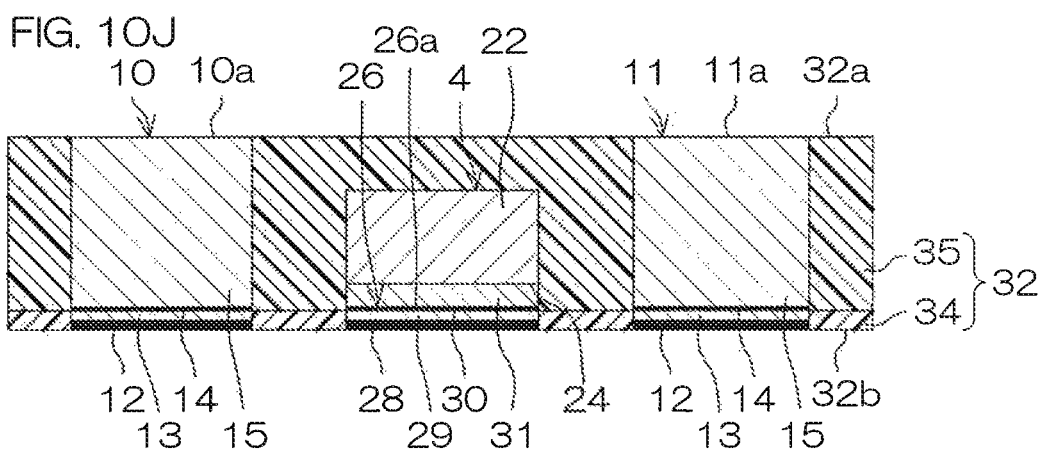

Next, referring to FIG. 10J, the nitride film is removed from the sealing resin 32 by an etching method, for example.

Figure 10K:
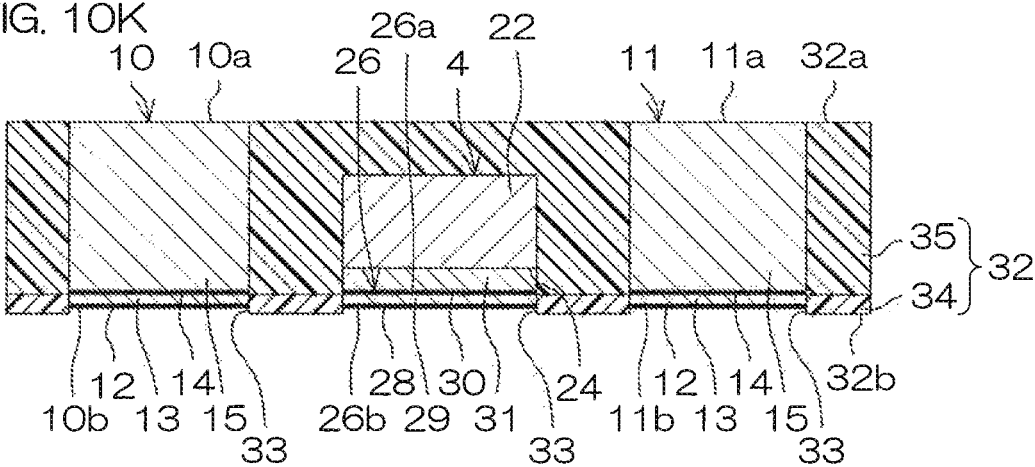

Next, referring to FIG. 10K, the Ti layers that forms the lowermost layer of the first seed layers 12 and the lowermost layer of the first pad seed layers 28 are removed by an etching method, for example. Thereby, recess portions 33 are formed in regions between the lower surfaces 10b, 11b of the pair of pillar electrodes 10, 11 and the lower surface 32b of the sealing resin 32. In addition, recess portions 33 are formed in regions between the lower surfaces 26b, 27b of the pair of pad electrodes 26, 27 and the lower surface 32b of the sealing resin 32.

Figure 10L:
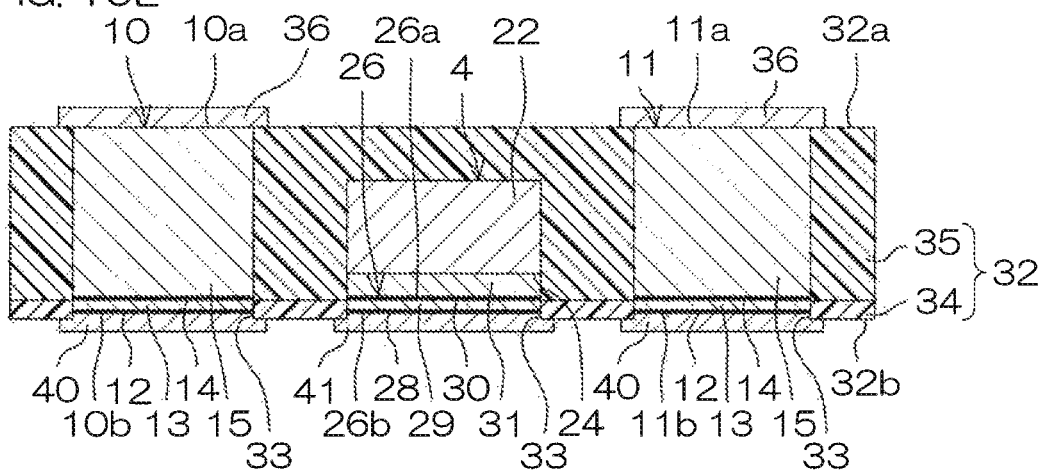

Next, referring to FIG. 10L, the upper surface electrode layers 36 (see also FIG. 8), the first lower surface electrode layers 40 and a second lower surface electrode layers 41 (see also FIG. 9) are formed.

The step of forming the first lower surface electrode layers 40 and the step of forming the second lower surface electrode layers 41 may be performed after the step of forming the upper surface electrode layers 36. The step of forming the first lower surface electrode layers 40 and the step of forming the second lower surface electrode layers 41 may be performed before the step of forming the upper surface electrode layers 36. The step of forming the first lower surface electrode layers 40 and the step of forming the second lower surface electrode layers 41 may be performed simultaneously with the step of forming the upper surface electrode layers 36. The step of forming the first lower surface electrode layers 40 and the step of forming the second lower surface electrode layers 41 may be performed simultaneously.

The upper surface electrode layers 36 are formed by depositing Ni, Pd and Au on the upper surfaces 10a, 11a of the pair of pillar electrodes 10, 11 in this order by an electrolytic plating method, for example. The upper surface electrode layers 36 are formed so as to overlap the upper surface 32a of the sealing resin 32.

The first lower surface electrode layers 40 are formed by depositing Ni, Pd and Au on the lower surfaces 10b, 11b of the pair of pillar electrodes 10, 11 in this order by an electrolytic plating method, for example. The first lower surface electrode layers 40 are formed so as to overlap the lower surface 32b of the sealing resin 32.

The second lower surface electrode layers 41 are formed by depositing Ni, Pd and Au on the lower surfaces 26b, 27b of the pair of pad electrodes 26, 27 in this order by an electrolytic plating method, for example. The second lower surface electrode layers 41 are formed so as to overlap the lower surface 32b of the sealing resin 32.

Figure 10M:
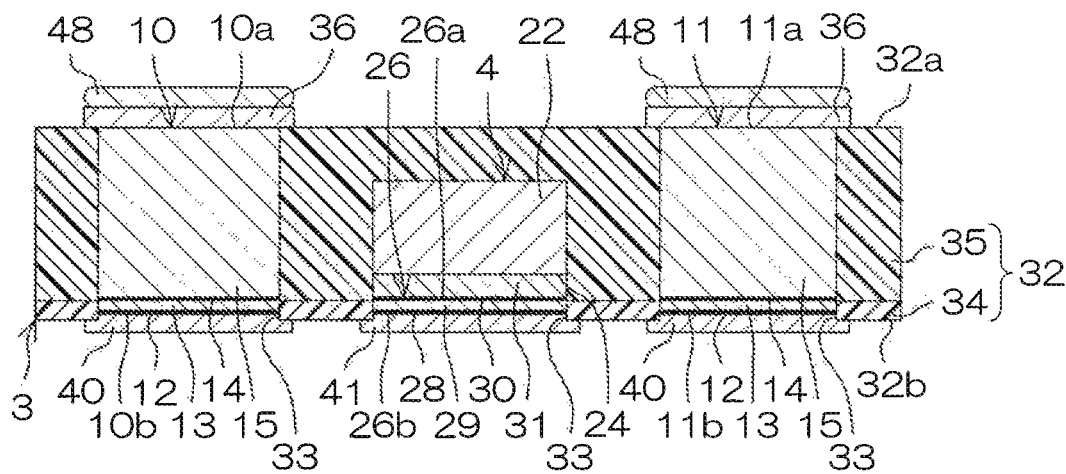

Next, referring to FIG. 10M, the second conductive bonding materials 48 are formed on the pair of upper surface electrode layers 36. The step of forming the second conductive bonding materials 48 includes a step of arranging solders respectively on the upper surface electrode layers 36 by a screen printing method, for example. Further, the step of forming the second conductive bonding materials 48 includes a step of melting the solders by a reflow method, for example. In this way, the interposer 3 onto which the first functional element 2 is bonded is formed.

Next, referring to FIG. 10N, the first functional element 2 is bonded onto the pair of pillar electrodes 10, 11. One first connecting electrode portion of the first functional element 2 is bonded onto the upper surface 10a of one pillar electrode 10 via the second conductive bonding material 48 and the upper surface electrode layer 36. The other first connecting electrode portion 9 of the first functional element 2 is bonded onto the upper surface 11a of the other pillar electrode 11 via the second conductive bonding material 48 and the upper surface electrode layer 36.

The second conductive bonding materials 48 may be previously formed on the pair of first connecting electrode portions 8, 9 of the first functional element 2. In this case, the step of forming the second conductive bonding materials 48 on the upper surface electrode layers 36 can be omitted.

However, in this case, the second conductive bonding materials 48 are to be formed on the pair of first connecting electrode portions 8, 9 of the relatively small first functional element 2. Therefore, it is easier to form the second conductive bonding materials 48 on the upper surface electrode layers 36.

Thereafter, the sealing resin 32 is selectively diced. Thereby, the electronic component 1 having a structure in which the first functional element 2 and the second functional element 4 are laminated in the vertical direction is manufactured.

As described above, the electronic component 1 according to the present preferred embodiment has a structure in which the first functional element 2 and the second functional element 4 having different sizes each other are integrated in the laminated state. Therefore, the first functional element 2 and the second functional element 4 are not to be handled separately.

In addition, according to the electronic component 1 of the present preferred embodiment, the lower surfaces 10b, 11b exposed from the sealing resin 32 in the pair of pillar electrodes 10, 11 can be used as the first mounting electrode surfaces. Similarly, the lower surfaces 26b, 27b exposed from the sealing resin 32 in the pair of pad electrodes 26, 27 can be used as the second mounting electrode surfaces.

Thereby, the first functional element 2 and the second functional element 4 can be mounted onto a mounting substrate in one step by bonding the lower surfaces 10b, 11b of the pair of pillar electrodes 10, 11 and the lower surfaces 26b, 27b of the pair of pad electrodes 26, 27 onto the mounting substrate.

Therefore, the electronic component 1 having a structure that is capable of efficiently mounting the first functional element 2 and the second functional element 4 having different sizes each other and that is excellent in handling convenience can be provided.

According to the manufacturing method of the electronic component 1 of the present preferred embodiment, the interposer 3 can be provided as well. According to the interposer 3 of the present preferred embodiment, the lower surfaces 10b, 11b exposed from the sealing resin 32 in the pair of pillar electrodes 10, 11 can be used as the first mounting electrode surfaces. Similarly, the lower surfaces 26b, 27b exposed from the sealing resin 32 in the pair of pad electrodes 26, 27 can be used as the second mounting electrode surfaces.

Thereby, the second functional element 4 can be mounted onto the mounting substrate simultaneously with the interposer 3 by bonding the first mounting electrode surfaces and the second mounting electrode surfaces onto the mounting substrate. Moreover, the interposer 3 has a connection area larger than a connection area of the second functional element 4. Therefore, the second functional element 4 can be easily mounted onto the mounting substrate by using the relatively large connecting area of the interposer 3.

Further, this interposer 3 has a structure where the upper surfaces 10a, 11a of the pair of pillar electrodes 10, 11 are exposed from the sealing resin 32. The upper surfaces 10a, 11a of the pair of pillar electrodes 10, 11 can be used as mounting electrode surfaces whereon the first functional element 2 having a size larger than a size of the second functional element 4 sealed by the sealing resin 32 is mounted.

Therefore, the large size first functional element 2 can be bonded onto the upper surfaces 10a, 11a of the pair of pillar electrodes 10, 11 regardless of the arrangement of the small size second functional element 4. As a result, a structure where the large size first functional element 2 is laminated on the small size second functional element 4 in a 3D mounting state is to be efficiently realized.

Further, the large size first functional element 2 can be also mounted onto the interposer 3 before the interposer 3 is mounted onto the mounting substrate. Even by such a method, the electronic component 1 which integrally has the large size first functional element 2 and the interposer 3 can be manufactured and provided. Therefore, the large size first functional element 2 and the interposer 3 are not to be handled separately.

Thereby, the first functional element 2 and the second functional element 4 can be mounted onto a mounting substrate in one step by bonding the lower surfaces 10b, 11b of the pair of pillar electrodes 10, 11 and the lower surfaces 26b, 27b of the pair of pad electrodes 26, 27 onto the mounting substrate.

Therefore, the interposer 3 having a structure that is capable of efficiently mounting the first functional element 2 and the second functional element 4 having different sizes each other and that is excellent in handling convenience can be provided.

<Second Preferred Embodiment>

Figure 11:
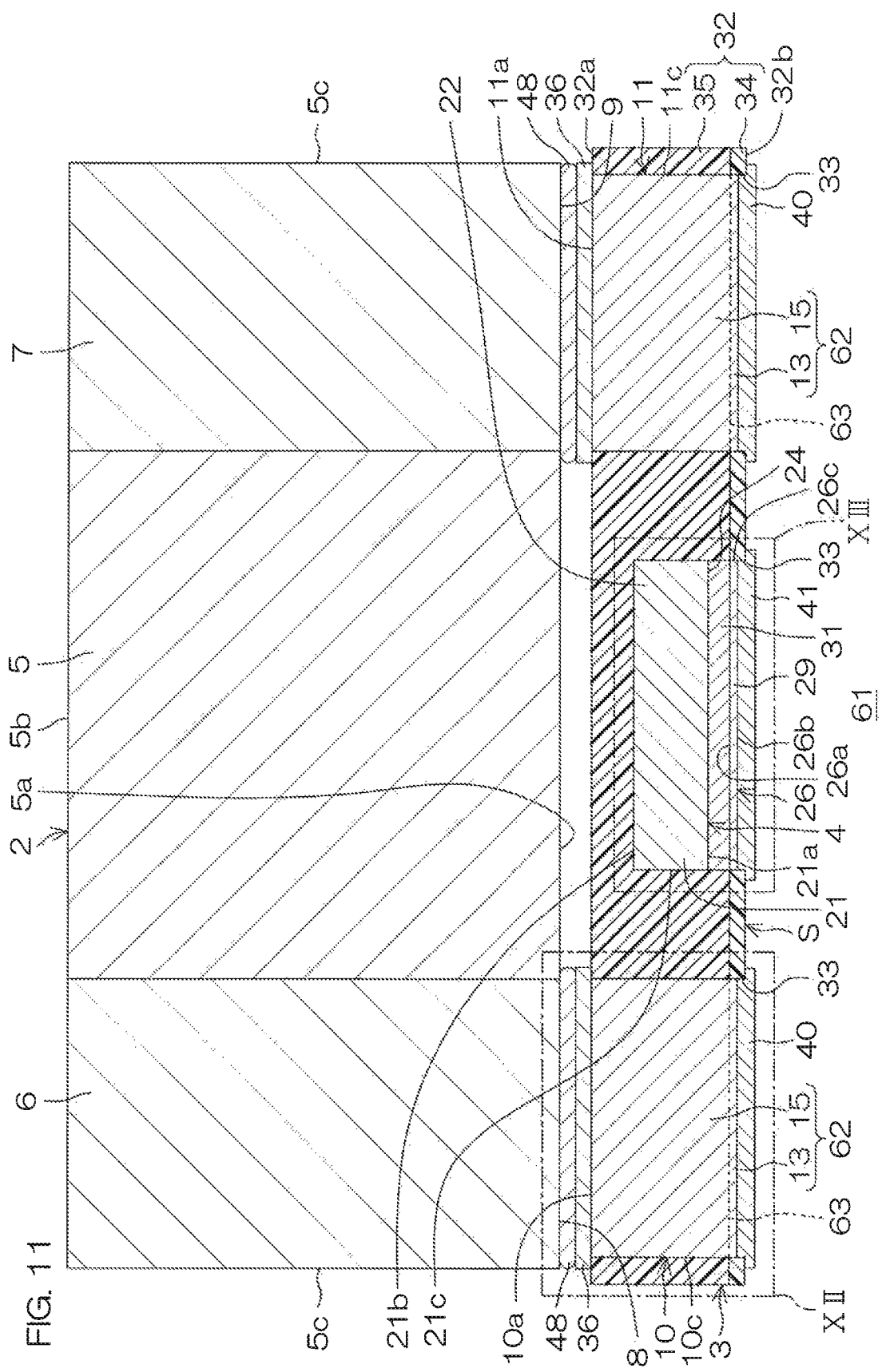
FIG. 11 is a cross-sectional view showing an electronic component according to a second preferred embodiment of the present invention.
Figure 12:
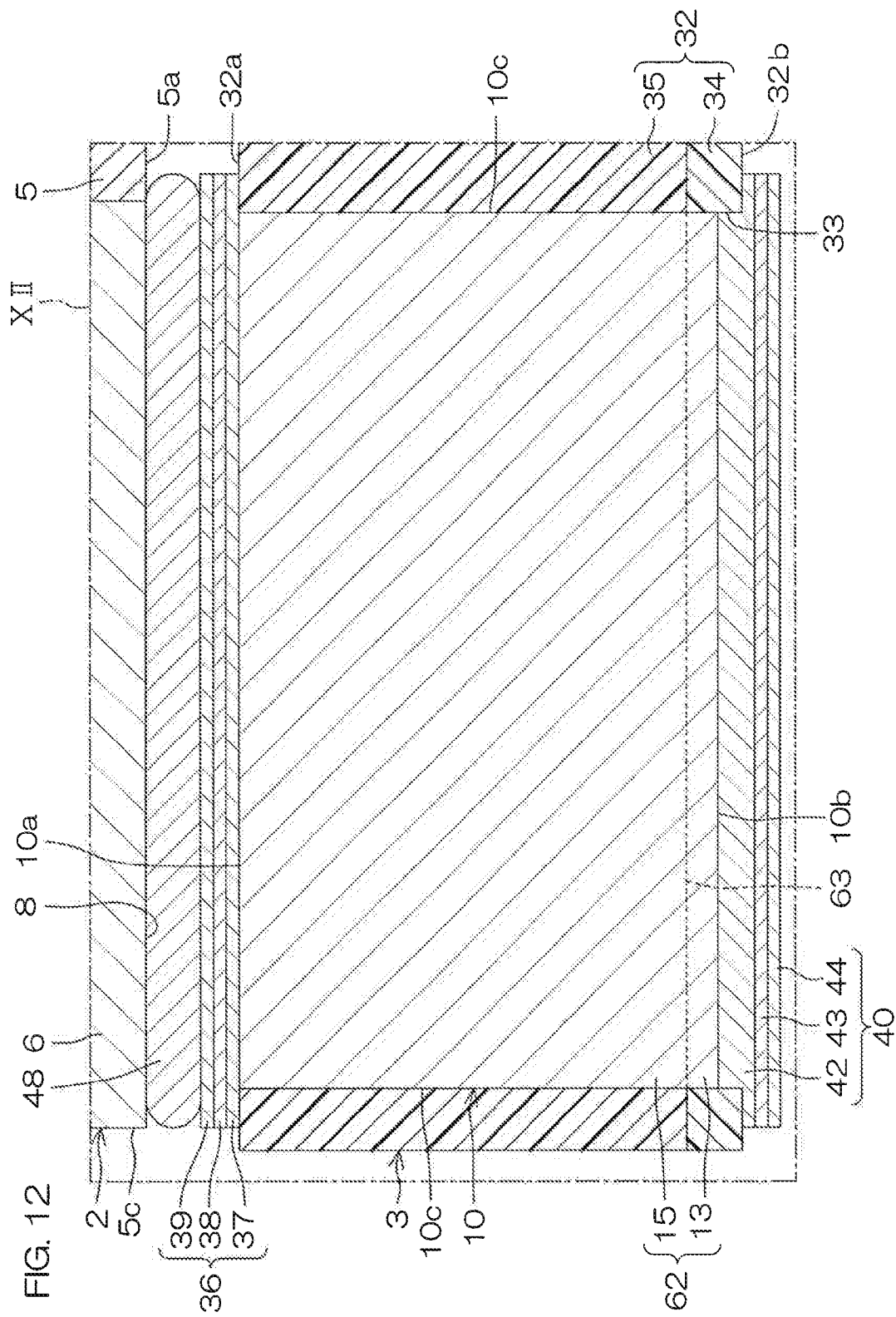
FIG. 12 is an enlarged view of a region XII shown in FIG. 11.
Figure 13:
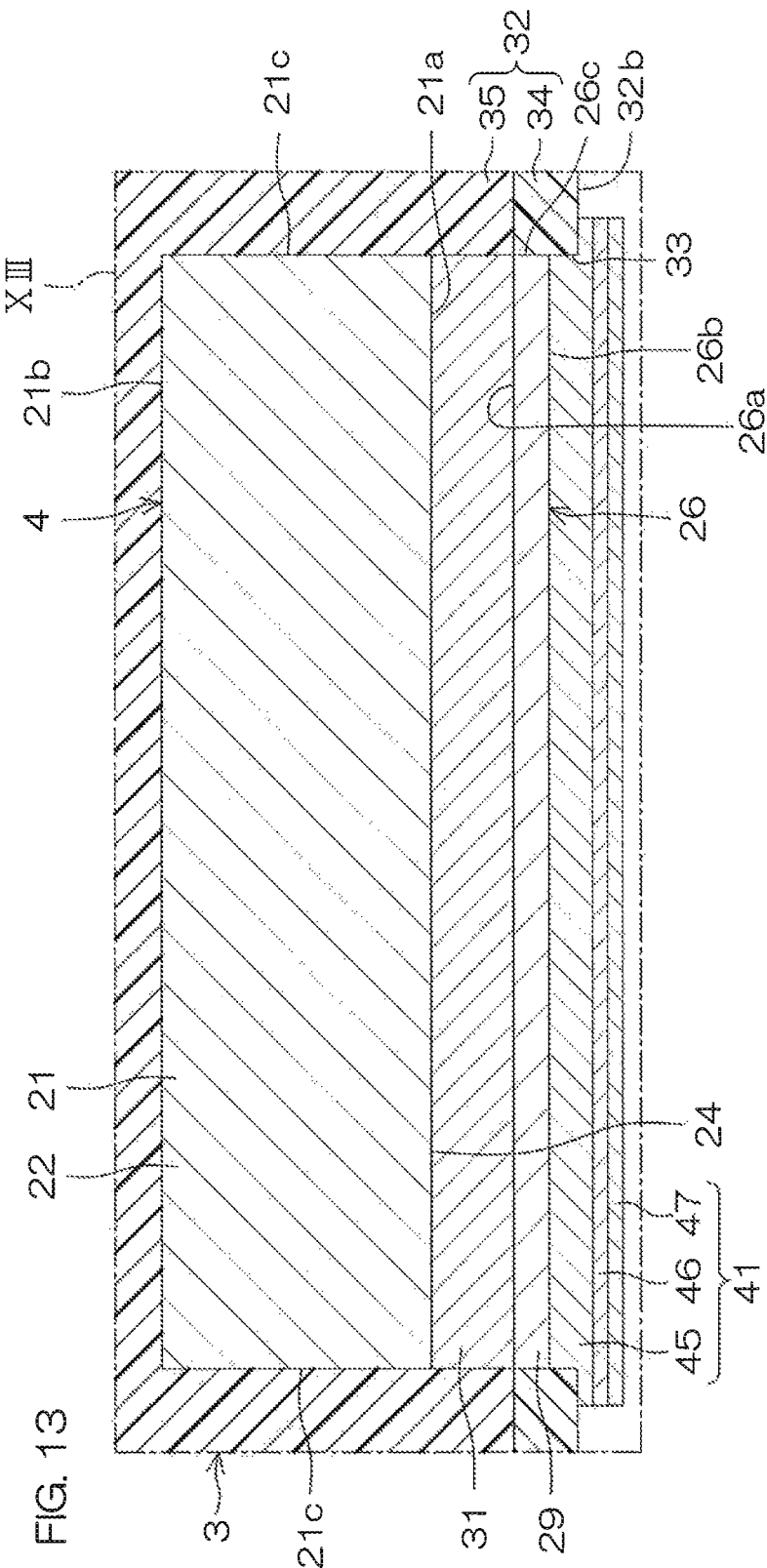
FIG. 13 is an enlarged view of a region XIII shown in FIG. 11.

FIG. 11 is a cross-sectional view showing an electronic component 61 according to a second preferred embodiment of the present invention. FIG. 12 is an enlarged view of a region XII shown in FIG. 11. FIG. 13 is an enlarged view of a region XIII shown in FIG. 11. FIG. 11 is a cross-sectional view of a portion corresponding to FIG. 6 described above. In FIG. 11 to FIG. 13, the same reference numerals are applied to the same structures as those described in the first preferred embodiment, and the description thereof is omitted.

Referring to FIG. 11 to FIG. 13, the pair of pillar electrodes 10, 11 respectively includes a single conductive material layer 62 made of a single conductive material. Each of the single conductive material layers 62 is, for example, made of Cu (copper). The upper surface 10a and the lower surface 10b of one pillar electrode 10 are formed by the single conductive material layer 62. The upper surface 11a and the lower surface 11b of the other pillar electrode 11 are formed by the single conductive material layer 62.

The single conductive material layers 62 may respectively include the first electrode layer 13 and the second electrode layer 15. The second electrode layer 15 may be formed directly on the first electrode layer 13. That is, in the present preferred embodiment, the pair of pillar electrodes 10, 11 may not have the first seed layer 12 and the second seed layer 14, unlike the first preferred embodiment.

The first electrode layer 13 and the second electrode layer 15 may be integrally formed in each of the single conductive material layers 62. The each of the single conductive material layers 62 may have a boundary portion 63 between the first electrode layer 13 and the second electrode layer 15.

Referring to FIG. 11 to FIG. 13, the pair of pad electrodes 26, 27 may be respectively formed only by the pad electrode layer 29. That is, in the present preferred embodiment, the pair of pad electrodes 26, 27 may not have the first pad seed layer 28 and the second pad seed layer 30, unlike the first preferred embodiment.

The first conductive bonding materials 31 are respectively formed on the upper surfaces 26a, 27a of the pair of pad electrodes 26, 27. The first conductive bonding materials 31 are in contact with the pad electrode layers 29 of the pair of pad electrodes 26, 27.

The sealing resin 32 includes the first sealing resin 34 and the second sealing resin 35. The first sealing resin 34 covers parts of lateral surfaces of the single conductive material layers 62 in the pillar electrodes 10, 11. The first sealing resin 34 also covers the lateral surfaces of the pad electrode layers 29 in the pair of pad electrodes 26, 27. The second sealing resin 35 covers lateral surfaces exposed from the first sealing resin 34 in the single conductive material layers 62 of the pillar electrodes 10, 11. The second sealing resin 35 also covers the outer surfaces of the first conductive bonding materials 31, and the outer surface of the second functional element 4.

The boundary portion between the first sealing resin 34 and the second sealing resin 35 may be located on the substantially same plane as the boundary portion 63 between the first electrode layer 13 and the second electrode layer 15.

As described above, according to the electronic component 61 of the present preferred embodiment, the substantially same effect as the effect described in the first preferred embodiment is to be realized.

Further, in the electronic component 61 according to the present preferred embodiment, the pair of pillar electrodes 10, 11 respectively includes the single conductive material layer 62 made of Cu (copper). This makes it possible to reduce the resistance value of the pair of pillar electrodes 10, 11.

Further, in the electronic component 61 according to the present preferred embodiment, the pair of pad electrodes 26, 27 respectively includes only the pad electrode layer 29 made of Cu (copper). This makes it possible to reduce the resistance value of the pair of pad electrodes 26, 27.

<Manufacturing Method of the Electronic Component 61> the electronic component 61 of the present preferred embodiment can be manufactured by changing the manufacturing method of the electronic component 1 according to the first preferred embodiment as follows.

(A) In the step of FIG. 10C described above, the patterning step of the first seed layer 53 is omitted.

(B) In the step of FIG. 10E described above, the step of forming the second seed layers 14 is omitted.

(C) In the step of FIG. 10F described above, a step of directly forming the second electrode layers 15 on the upper surfaces of the first seed layers 12 is performed.

(D) In the step of FIG. 10G described above, a step of directly forming the first conductive bonding materials 31 on the upper surfaces of the pad electrode layers 29 is performed.

(E) In the step of FIG. 10K described above, a step of removing the first seed layer 53 is performed.

In the manufacturing method of the present preferred embodiment, the second electrode layers 15 are formed directly on the first electrode layers 13. Further, the first conductive bonding materials 31 are formed directly on the pad electrode layers 29. Thereby, the step of forming the second seed layer 55 (see FIG. 10E) can be omitted.

In the manufacturing method of the present preferred embodiment, in the step of FIG. 10K described above, the entire first seed layer 53 is removed. Thereby, the patterning step of the first seed layer 53 (see FIG. 10C) can be omitted.

Therefore, according to the manufacturing method of the present preferred embodiment, it is possible to reduce the cost by reducing the number of steps.

<Third Preferred Embodiment>

Figure 14:
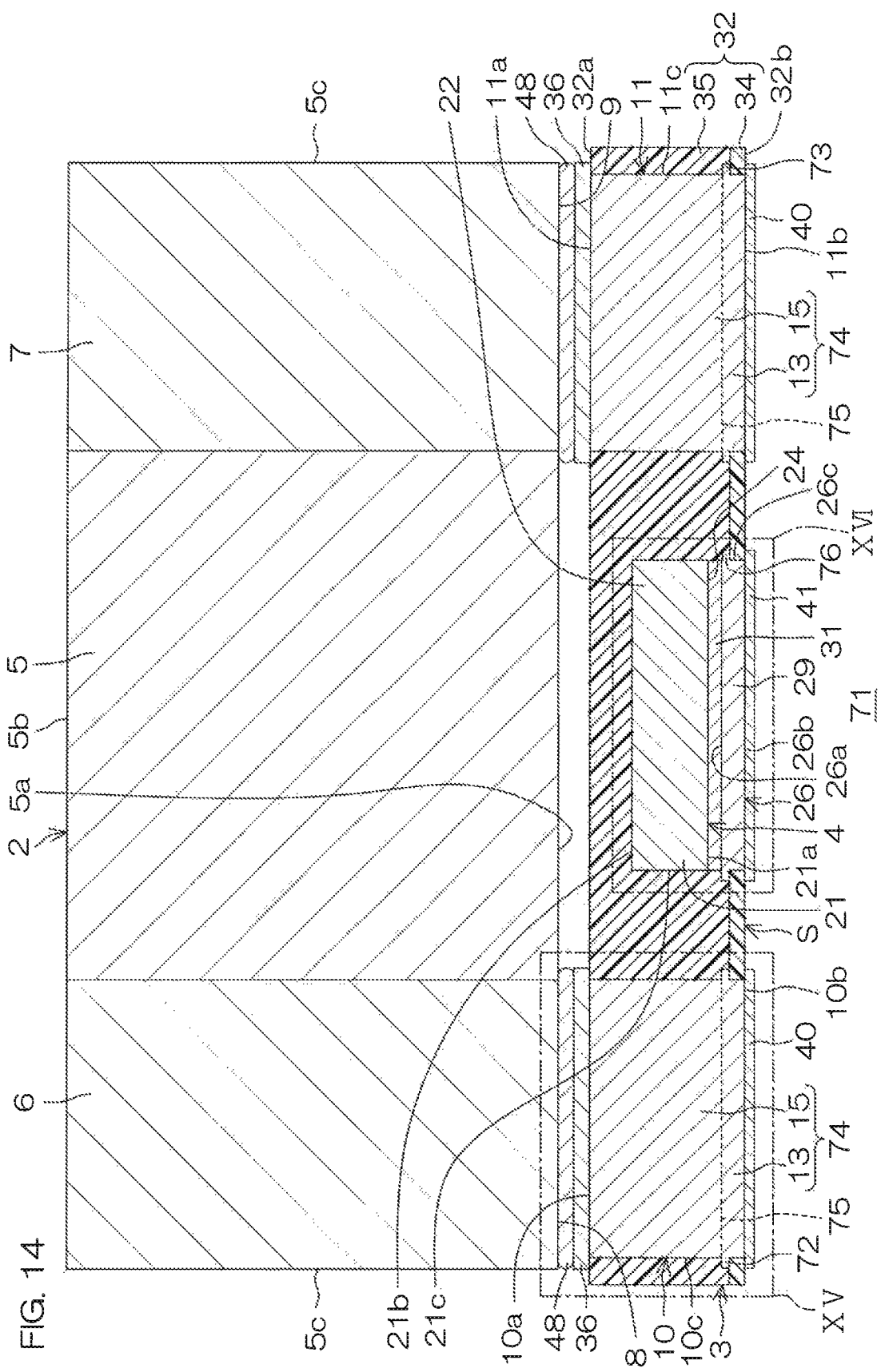
FIG. 14 is a cross-sectional view showing an electronic component according to a third preferred embodiment of the present invention.
Figure 15:
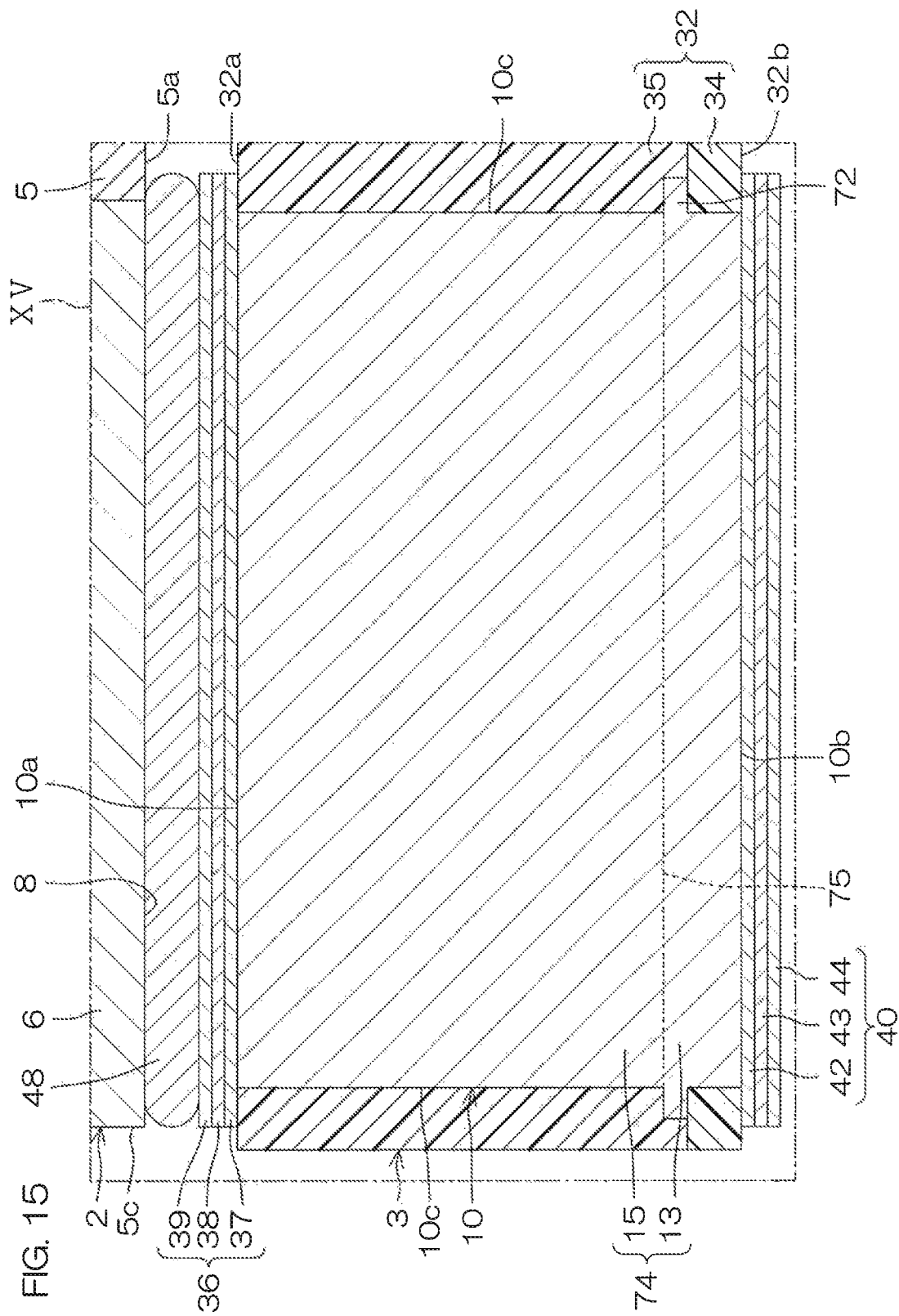
FIG. 15 is an enlarged view of a region XV shown in FIG. 14.

FIG. 14 is a cross-sectional view showing an electronic component 71 according to a third preferred embodiment of the present invention. FIG. 15 is an enlarged view of a region XV shown in FIG. 14. FIG. 16 is an enlarged view of a region XVI shown in FIG. 14. FIG. 14 is a cross-sectional view of a portion corresponding to FIG. 6 described above.

In FIG. 14 to FIG. 16, the same reference numerals are applied to the same structures as those described in the first preferred embodiment, and the description thereof is omitted.

Referring to FIG. 14 to FIG. 16, in the present preferred embodiment, one pillar electrode 10 has a projection portion 72 projecting outward from the lateral surface 10c. Similarly, the other pillar electrode 11 has a projection portion 73 projecting outward from the lateral surface 11c. The projection portions 72, 73 are formed lower side of the pair of pillar electrodes 10, 11.

The pair of pillar electrodes 10, 11 respectively includes a single conductive material layer 74. The upper surface 10a and the lower surface 10b of one pillar electrode 10 are formed by the single conductive material layer 74. The upper surface 11a and the lower surface 11b of the other pillar electrode 11 are formed by the single conductive material layer 74. That is, in the present preferred embodiment, the pair of pillar electrodes 10, 11 may not have the first seed layer 12 and the second seed layer 14, unlike the first preferred embodiment.

The single conductive material layers 74 may respectively include the first electrode layer 13 and the second electrode layer 15. That is, each of the single conductive material layers 74 may have a structure in which the second electrode layer 15 is directly formed on the first electrode layer 13.

The first electrode layer 13 and the second electrode layer 15 may be integrally formed in the each of the single conductive material layers 74. The single conductive material layers 74 may respectively have a boundary portion 75 formed in a region between the first electrode layer 13 and the second electrode layer 15.

The projection portion 72 of one pillar electrode 10 is formed by a convex portion of the first electrode layer 13. The convex portion of the first electrode layer 13 is formed by a portion protruding outward from the lateral surface 10c of the pillar electrode 10 in the first electrode layer 13. Similarly, the projection portion 73 of the other pillar electrode 11 is formed by a convex portion of the first electrode layer 13. The convex portion of the first electrode layer 13 is formed by a portion protruding outward from the lateral surface 11c of the other pillar electrode 11 in the first electrode layer 13.

One pad electrode 26 has a projection portion 76 projecting outward from the lateral surface 26c of the pair of pad electrodes 26. Similarly, the other pad electrode 27 has a projection portion 76 projecting outward from the lateral surface 27c of the pair of pad electrodes 27. The projection portions 76 are formed upper side of the pair of pad electrodes 26, 27.

The pair of pad electrodes 26, 27 respectively includes only the pad electrode layer 29. That is, in the present preferred embodiment, the pair of pad electrodes 26, 27 may not have the first pad seed layer 28 and the second pad seed layer 30, unlike the first preferred embodiment.

The projection portion 76 of one pad electrodes 26 is formed by a convex portion of the pad electrode layer 29. The convex portion of the pad electrode layer 29 is formed by a portion protruding outward from the lateral surface 26c of the pad electrodes 26 in the pad electrode layer 29. Similarly, the projection portion 76 of the other pad electrodes 27 is formed by a convex portion of the pad electrode layer 29. The convex portion of the pad electrode layer 29 is formed by a portion protruding outward from the lateral surface 27c of the pad electrodes 27 in the pad electrode layer 29.

The first conductive bonding materials 31 are respectively formed on the upper surfaces 26a, 27a of the pair of pad electrodes 26, 27. The first conductive bonding materials 31 are in contact with the pad electrode layers 29 of the pair of pad electrodes 26, 27.

The sealing resin 32 includes a first sealing resin 34 and a second sealing resin 35. In the present preferred embodiment, the first sealing resin 34 is made of a photosensitive resin (for example, a photosensitive polyimide resin).

The first sealing resin 34 is formed at lower regions of the single conductive material layers 74 so as to cover the lateral surfaces of the single conductive material layer 74. The first sealing resin 34 also covers the lateral surfaces of the pad electrode layers 29 in the pair of pad electrodes 26, 27. The second sealing resin 35 is formed on the first sealing resin 34 so as to cover the lateral surfaces exposed from the first sealing resin 34 in the single conductive material layer 74. Further, the second sealing resin 35 covers the outer surfaces of the first conductive bonding materials 31 and the outer surface of the second functional element 4 on the first sealing resin 34.

The projection portions 72, 73 of the pair of pillar electrodes 10, 11 are sandwiched by the first sealing resin 34 and the second sealing resin 35. More specifically, the projection portions 72, 73 of the pair of pillar electrodes 10, 11 respectively include an overlapped portion that covers the upper surface of the first sealing resin 34. The overlapped portions of the projection portions 72, 73 are covered with the second sealing resin 35 on the upper surface of the first sealing resin 34.

The projection portions 76 of the pair of pad electrodes 26, 27 are sandwiched by the first sealing resin 34 and the second sealing resin 35. More specifically, the projection portions 76 of the pair of pad electrodes 26, 27 respectively include an overlapped portion that covers the upper surface of the first sealing resin 34. The overlapped portions of the projection portions 76 are covered with the second sealing resin 35 on the upper surface of the first sealing resin 34.

The lower surfaces 10b, 11b of the pair of pillar electrodes 10, 11 are exposed from the lower surface 32b of the sealing resin 32. In the present preferred embodiment, the lower surfaces 10b, 11b of the pair of pillar electrodes 10, 11 may be connected to the lower surface 32b of the sealing resin 32 without a step.

The lower surfaces 26b, 27b of the pair of pad electrodes 26, 27 are exposed from the lower surface 32b of the sealing resin 32. The lower surfaces 26b, 27b of the pair of pad electrodes 26, 27 in the present preferred embodiment may be connected to the lower surface 32b of the sealing resin 32 without a step.

<Manufacturing Method of the Electronic Component 71>

FIG. 17A to FIG. 17E are cross-sectional views showing steps of manufacturing the electronic component 71 shown in FIG. 14. The electronic component 71 is manufactured through the substantially same steps as the manufacturing method of the electronic component 1 according to the first preferred embodiment. Hereinafter, steps different from the manufacturing method of the electronic component 1 according to the first preferred embodiment is described with reference to FIG. 17A to FIG. 17E.

Referring to FIG. 17A, first, the substrate 51 is prepared. The nitride film 52 and the first seed layer 53 are formed on the upper surface of the substrate 51.

Next, referring to FIG. 17B, the first seed layer 53 is coated by a photosensitive polyimide to be the first sealing resin 34. Next, the photosensitive polyimide is selectively exposed and developed. Thereby, the first sealing resin 34 having a predetermined pattern and made of the photosensitive polyimide is formed on the first seed layer 53. The first sealing resin 34 selectively has openings 34a that expose regions where the pair of pillar electrodes 10, 11 and the pair of pad electrodes 26, 27 are to be formed.

Next, Cu is deposited by an electrolytic plating method, for example, and the first electrode layers 13 and the pad electrode layers 29 are formed. The first electrode layers 13 and the pad electrode layers 29 are formed on the first seed layer 53 exposed from the openings 34a of the first sealing resin 34.

The first electrode layers 13 are formed so as to overlap the upper surface of the first sealing resin 34. Thereby, projection portions 72, 73 of the pair of pillar electrodes 10, 11 are formed. Further, the pad electrode layers 29 are formed so as to overlap the upper surface of the first sealing resin 34. Thereby, the projection portions 76 of the pair of pad electrodes 26, 27 are formed.

Next, referring to FIG. 17C, a resist mask 80 having a predetermined pattern is formed on the first sealing resin 34. The resist mask 80 covers the first electrode layers 13. Further, the resist mask 80 selectively has openings 80a that expose the upper surfaces of the pad electrode layers 29 except the projection portions 76.

Next, solder is deposited by an electrolytic plating method, for example, and the first conductive bonding materials 31 are formed. The first conductive bonding materials 31 are respectively formed on the pad electrode layers 29 exposed from the openings 80a of the resist mask 80. The solder may be an SnSbNi based solder. The resist mask 80 is removed after the first conductive bonding materials 31 are formed.

Figure 17D:
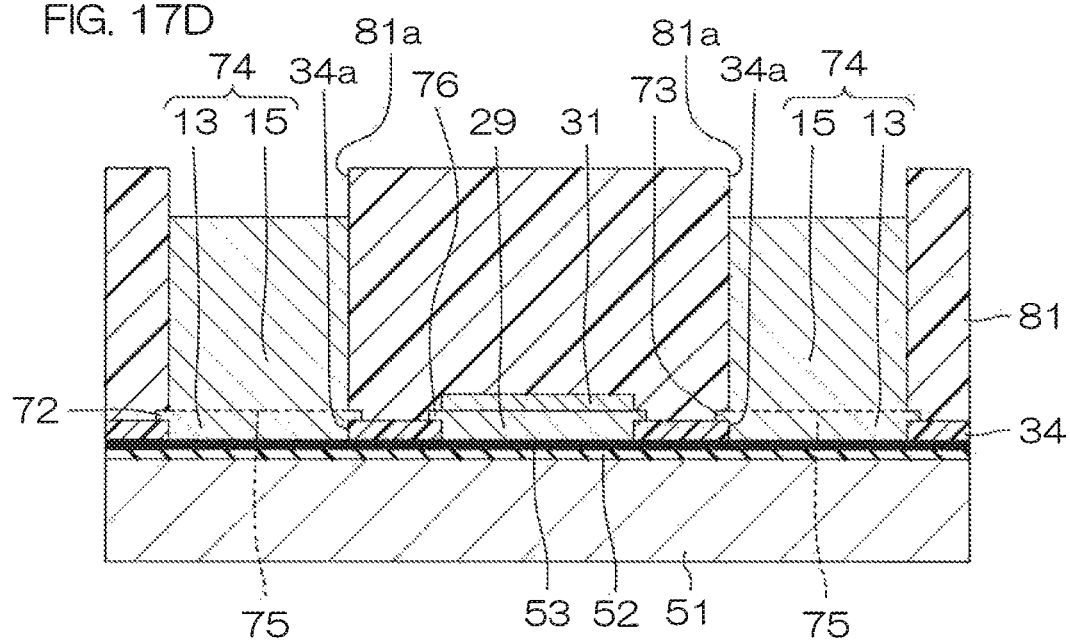

Next, referring to FIG. 17D, a resist mask 81 having a predetermined pattern is formed on the first sealing resin 34. The resist mask 81 covers the pair of pad electrodes 26, 27. Further, the resist mask 81 selectively has openings 81a that expose the upper surfaces of the first electrode layers 13 except the projection portions 72, 73.

Next, Cu is deposited by an electrolytic plating method, for example, and the second electrode layers 15 are formed. The second electrode layers 15 are formed on the upper surfaces of the pair of first electrode layers 13 exposed from the openings 81a of the resist mask 81. The second electrode layers 15 are made of the same material (copper in the present preferred embodiment) as the first electrode layers 13. Therefore, the second electrode layers 15 and the first electrode layers 13 are integrally formed.

Thereby, the pair of pillar electrodes 10, 11 respectively having a laminated structure including the first electrode layer 13 and the second electrode layer 15 are formed. The resist mask 81 is removed after the second electrode layers 15 are formed.

Figure 17E:
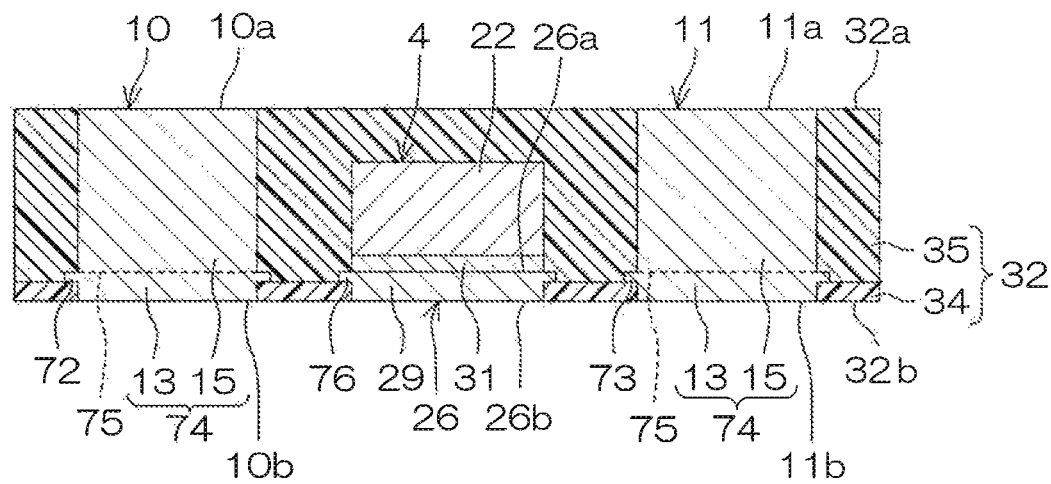

Next, the steps of FIG. 17E are performed. The steps of FIG. 17E are performed instead of the steps of FIG. 10K after the steps of FIG. 10H to FIG. 10J.

In the steps of FIG. 17E, the entire first seed layer 53 is removed by etching method, for example. Thereby, the pair of pillar electrodes 10, 11 respectively including projection portions 72, 73 and having the single conductive material layer 74 is formed. Thereafter, the electronic component 71 is manufactured through the substantially same steps as those in FIG. 10H to FIG. 10N.

As described above, according to the electronic component 71 of the present preferred embodiment, the substantially same effect as the effect described in the first preferred embodiment is to be realized.

Further, in the electronic component 71 according to the present preferred embodiment, the pair of pillar electrodes 10, 11 respectively includes the single conductive material layer 74 made of Cu (copper). This makes it possible to reduce the resistance value of the pair of pillar electrodes 10, 11.

Further, in the electronic component 71 according to the present preferred embodiment, the pair of pad electrodes 26, 27 respectively includes only the pad electrode layer 29 made of Cu (copper). This makes it possible to reduce the resistance value of the pair of pad electrodes 26, 27.

Further, in the manufacturing method of the present preferred embodiment, the entire first seed layer 53 is removed (see FIG. 17E). Thereby, the patterning step of the first seed layer 53 (see FIG. 10C) can be omitted.

Further, in the manufacturing method of the present preferred embodiment, the photosensitive polyimide which is used in the steps of forming the first electrode layers 13 and the pad electrode layers 29 can be used as the first sealing resin 34 as it is (see FIG. 17B). Therefore, the grinding process (see FIG. 10E) of the first sealing resin 34 can be omitted.

Further, in the manufacturing method of the present preferred embodiment, the second electrode layers 15 are directly formed on the first electrode layers 13, and the first conductive bonding materials 31 are directly formed on the pad electrode layers 29. Thus, the step of forming the second seed layer 55 (see FIG. 10E) can be omitted.

Therefore, according to the manufacturing method of the present preferred embodiment, it is possible to reduce the cost by reducing the number of steps.

<Another Preferred Embodiments>

Although the preferred embodiments of the present invention are described above, the present invention can be implemented in still another preferred embodiments.

Figure 18:
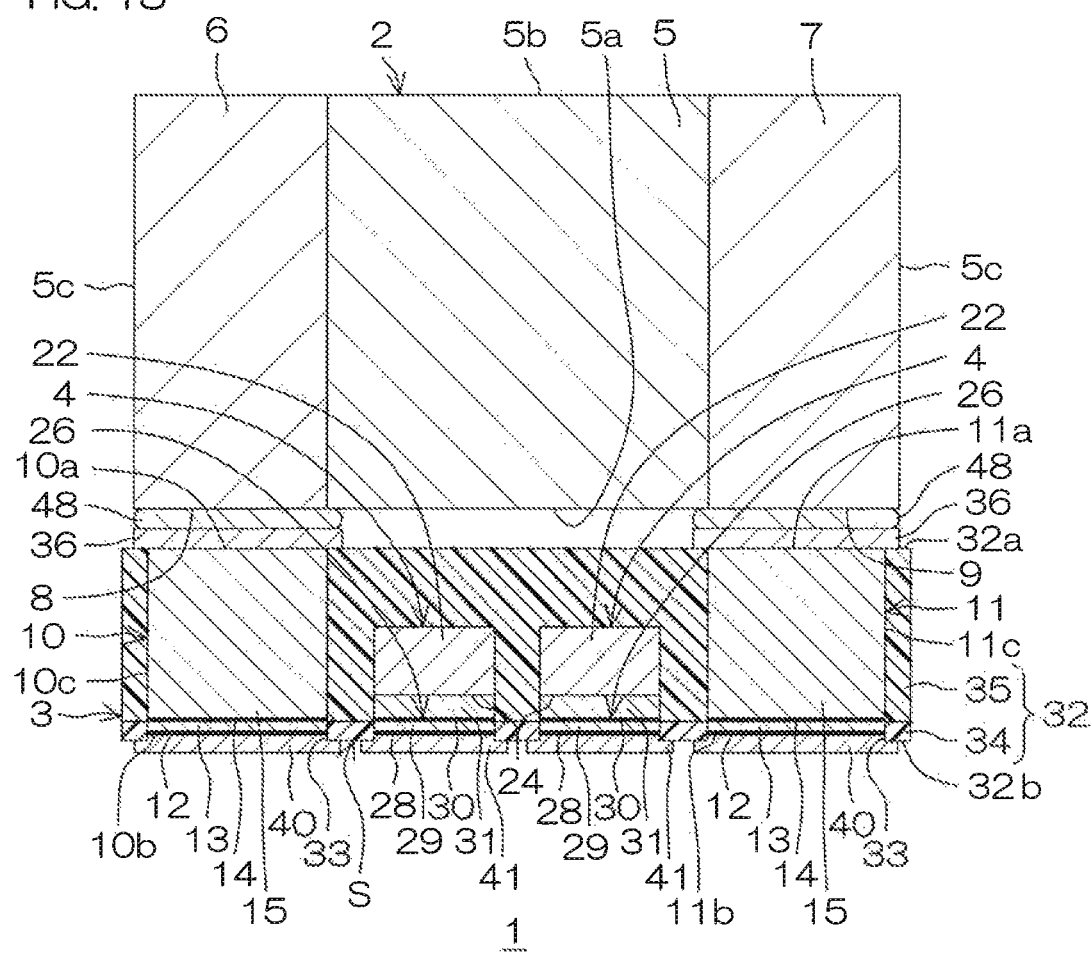
FIG. 18 is a cross-sectional view showing a first modification of the electronic component shown in FIG. 1.

For example, a structure shown in FIG. 18 may be adopted for the electronic component 1 according to the first preferred embodiment. FIG. 18 is a cross-sectional view showing a first modified example of the electronic component 1 according to the first preferred embodiment. In FIG. 18, the same reference numerals are applied to the same structures as those described in the first preferred embodiment, and the description thereof is omitted.

Referring to FIG. 18, in the present modified example, two of second functional elements 4 are arranged in the space S defined by the first mounting surface 5a of the first functional element 2 and the pair of pillar electrodes 10, 11.

That is, the interposer 3 includes a plurality of second functional elements 4 in the space S sandwiched by the pair of pillar electrodes 10, 11.

The pair of pad electrodes 26, 27 to be connected to one second functional element 4 and the pair of pad electrodes 26, 27 to be connected to the other second functional element 4 are arranged in the space S. Each of the second functional elements 4 is bonded onto the corresponding pair of pad electrodes 26, 27 via the first conductive bonding materials 31.

As described above, the electronic component 1 according to the present modified example has a structure in which a plurality (two or more) of the second functional elements 4 are arranged in the space S. Thereby, a 3D mounting structure including a first functional element 2 and a plurality of the second functional elements 4 can be realized by one mounting step. Further, one first functional element 2 and the plurality of the second functional elements 4 are not to be handled separately. Consequently, handling convenience can be enhanced.

The structure in which the plurality (two or more) of the second functional elements 4 are arranged in the space S can be adopted for the second preferred embodiment and the third preferred embodiment as well.

A structure shown in FIG. 19 may be adopted for the electronic component 1 according to the first preferred embodiment. FIG. 19 is a cross-sectional view showing a second modified example of the electronic component 1 according to the first preferred embodiment. In FIG. 19, the same reference numerals are applied to the same structures as those described in the first preferred embodiment, and the description thereof is omitted.

Referring to FIG. 19, in the present modified example, two of first functional elements 2 are bonded onto the interposer 3. The interposer 3 includes a pair of pillar electrodes 10, 11 to be connected to one first functional element 2 and a pair of pillar electrodes 10, 11 to be connected to the other first functional element 2. The first functional elements 2 are respectively bonded onto the corresponding pair of pillar electrodes 10, 11 via the second conductive bonding materials 48.

The interposer 3 includes a space S defined by the first mounting surface 5a of one first functional element 2 and the pair of pillar electrodes 10, 11 to be connected to one first functional element 2. The interposer 3 includes a space S defined by the first mounting surface 5a of the other first functional element 2 and the pair of pillar electrodes 10, 11 to be connected to the other first functional element 2.

Referring to FIG. 18, the plurality (two or more) of second functional elements 4 may be arranged in the spaces S respectively. Referring to FIG. 1, a second functional element 4 may be arranged in the spaces S respectively.

As described above, in the electronic component 1 according to the present modified example, the interposer 3 has a structure on which the plurality of first functional elements 2 are bonded. Thereby, a 3D mounting structure including the plurality of the first functional elements 2 and the plurality of second functional elements can be realized by one mounting step. Further, the plurality of the first functional elements 2 and the plurality of second functional elements 4 are not to be handled separately. Consequently, handling convenience can be enhanced.

The structure in which the plurality of (two or more) the first functional elements 2 are bonded onto the interposer 3 can be adopted for the second preferred embodiment and the third preferred embodiment as well.

In each of the preferred embodiments, the first conductive bonding materials 31 and the second conductive bonding materials 48 may include a lead-based solder as well.

In each of the preferred embodiments, the first conductive bonding materials 31 and the second conductive bonding materials 48 may be a conductive paste including Au (gold), Ag (silver) or Cu (copper) instead of solder.

This application corresponds to Patent Application No. 2016-60252 filed in Japanese Patent Office on Mar. 24, 2016 and the entire disclosures of the applications are incorporated herein by reference.

Although the preferred embodiments of the present invention have been described in detail as above, these are merely specific examples used to clarify the technical contents of the present invention, and the present invention should not be understood as being limited to these examples, and the scope of the present invention is to be determined solely by the appended claims.

What is claimed is:

1. An electronic component comprising:
   a first functional element that includes a first mounting surface on which a pair of first connecting electrode portions is formed, the first functional element being a chip component;
   a pair of pillar electrodes that have a first upper surface and a first lower surface respectively, the first upper surface is connected to the corresponding first connecting electrode portion;
   a second functional element that is arranged in a space defined by the first mounting surface of the first functional element and the pair of pillar electrodes and that includes a second mounting surface on which a pair of second connecting electrode portions is formed, the second functional element being a chip component;
   a pair of pad electrodes that have a second upper surface and a second lower surface respectively, the second upper surface is connected to the corresponding second connecting electrode portion; and
   a sealing resin that is formed in a region below the first mounting surface of the first functional element and seals the pair of pillar electrodes, the pair of pad electrodes and the second functional element so as to expose the first lower surfaces of the pair of pillar electrodes and the second lower surfaces of the pair of pad electrodes, wherein
   the second functional element is entirely overlapped by the first functional element in a plan view,
   the sealing resin includes a first portion that seals a top surface of the second functional element and a second portion that seals a side surface of the second functional element, and
   the first portion and the second portion are composed of a same sealing material.

2. The electronic component according to claim 1, wherein the sealing resin exposes an outer surface of the first functional element.

3. The electronic component according to claim 1, wherein the second functional element is arranged such that an opposing direction of the pair of second connecting electrode portions intersects an opposing direction of the pair of first connecting electrode portions of the first functional element in a plan view.

4. The electronic component according to claim 1, wherein the pair of pillar electrodes respectively have a laminated structure including a first seed layer, a first electrode layer, a second seed layer, and a second electrode layer laminated in this order from the first lower surface side.

5. The electronic component according to claim 4, wherein the sealing resin includes a first sealing resin and a second sealing resin formed on the first sealing resin,
   the first sealing resin covers the first seed layers and the first electrode layers, and
   the second sealing resin covers the second seed layers and the second electrode layers.

6. The electronic component according to claim 1, wherein the pair of pillar electrodes respectively have a single layer structure including a single conductive material layer.

7. The electronic component according to claim 6, wherein the sealing resin includes a first sealing resin and a second sealing resin formed on the first sealing resin,
   the first sealing resin covers lower regions of the pair of pillar electrodes adjacent to the first lower surfaces, and
   the first sealing resin covers upper regions of the pair of pillar electrodes adjacent to the first upper surfaces.

8. The electronic component according to claim 1, wherein the pair of pillar electrodes respectively have a lateral surface that connects the first upper surface and the first lower surface, and
   a projection portion is respectively formed on the lateral surfaces of the pair of pillar electrodes so as to project outward.

9. The electronic component according to claim 8, wherein the pair of pillar electrodes respectively have a laminated structure including a first electrode layer and a second electrode layer laminated in this order from the first lower surface side, and
   the projection portion is formed by a part of the first electrode layer in each of the pair of pillar electrodes.

10. The electronic component according to claim 9, wherein the sealing resin includes a first sealing resin and a second sealing resin formed on the first sealing resin,
    the first sealing resin covers the first electrode layers, and
    the second sealing resin covers the second electrode layers.

11. The electronic component according to claim 10, wherein the projection portions of the pair of pillar electrodes are sandwiched by the first sealing resin and the second sealing resin.

12. The electronic component according to claim 1 further comprising a pair of upper electrode layers that is respectively connected to the corresponding first upper surfaces of the pair of pillar electrodes, wherein
    the pair of first connecting electrodes of the first functional element is electrically connected to the pair of pillar electrodes via the pair of upper electrode layers.

13. The electronic component according to claim 12, wherein the pair of upper electrode layers overlaps the sealing resin.

14. The electronic component according to claim 1 further comprising a pair of first lower electrode layers that is respectively connected to the corresponding first lower surfaces of the pair of pillar electrodes.

15. The electronic component according to claim 14, wherein the pair of first lower electrode layers overlaps the sealing resin.

16. The electronic component according to claim 1 further comprising a pair of second lower electrode layers that is respectively connected to the corresponding second lower surfaces of the pair of pillar electrodes respectively.

17. The electronic component according to claim 16, wherein the pair of second lower electrode layers overlaps the sealing resin.

18. The electronic component according to claim 1, wherein
the pair of pillar electrodes each extends in an extended direction perpendicular to an opposing direction of the pair of pillar electrodes in a plan view, and has a length in the extended direction that is greater than a length of the second functional element in the extended direction.

19. The electronic component according to claim 1, wherein
the first functional element has a thickness that is greater than a thickness of the second functional element.

20. The electronic component according to claim 1, wherein
the first functional element includes a functional element body and a pair of terminal electrodes having the pair of connecting electrodes on the first mounting surface, respectively,
the pair of terminal electrodes are spaced apart from each other in an opposing direction, and
the functional element body and the pair of terminal electrodes are overlapped with each other when viewed in the opposing direction.

21. The electronic component according to claim 1, wherein
the pair of pad electrodes is separated from each other in a first opposing direction and the pair of pillar electrodes is separated from each other in a second opposing direction, and
the pair of pad electrodes is arranged such that the first opposing direction of the pair of pad electrodes intersects the second opposing direction of the pair of pillar electrodes in a plan view.

22. An interposer comprising:
a pair of pillar electrodes that have a first upper surface and a first lower surface respectively and that is arranged at an interval from each other in an opposing direction;
a pair of pad electrodes that have a second upper surface and a second lower surface respectively and that is arranged at intervals each other in a space between the pair of pillar electrodes;
a functional element that has a mounting surface on which a pair of connecting electrode portions is formed and that is mounted onto the pair of pad electrodes in the space such that the pair of connecting electrode portions is connected to the second upper surfaces of the pair of pad electrodes; and
a sealing resin that seals the pair of pillar electrodes, the pair of pad electrodes and the functional element so as to expose the first upper surfaces of the pair of pillar electrodes, the first lower surfaces of the pair of pillar electrodes and the second lower surfaces of the pair of pad electrodes,
wherein the first upper surface of each of the pair of pillar electrodes extends in an extended direction perpendicular to the opposing direction of the pair of pillar electrodes in a plan view, and perpendicular to a depth direction between the first upper surface and the first lower surface, and has a length in the extended direction that is greater than a length of the functional element in the extended direction,
the sealing resin include a first portion that seals a top surface of the functional element, and a second portion that seals a side surface of the functional element, and
the first portion and the second portion are composed of a same sealing material.

23. The interposer according to claim 22, wherein the pair of pad electrodes is arranged such that an opposing direction of the pair of pad electrodes intersects the opposing direction of the pair of pillar electrodes in a plan view.

* * * * *